US 6,717,406 B2

(12) United States Patent
Sodickson

(10) Patent No.: US 6,717,406 B2
(45) Date of Patent: Apr. 6, 2004

(54) PARALLEL MAGNETIC RESONANCE IMAGING TECHNIQUES USING RADIOFREQUENCY COIL ARRAYS

(75) Inventor: Daniel K. Sodickson, Newton, MA (US)

(73) Assignee: Beth Israel Deaconess Medical Center, Inc., Boston, MA (US)

(*) Notice: Subject to any disclaimer, the term of this patent is extended or adjusted under 35 U.S.C. 154(b) by 0 days.

(21) Appl. No.: 09/524,217

(22) Filed: Mar. 14, 2000

(65) Prior Publication Data

US 2002/0158632 A1 Oct. 31, 2002

(51) Int. Cl.[7] ............................................. G01V 3/00
(52) U.S. Cl. ......................... 324/307; 324/309; 324/318
(58) Field of Search ................................. 324/309, 307, 324/300, 318, 306, 314, 322; 600/410, 422, 421

(56) References Cited

U.S. PATENT DOCUMENTS

| 4,825,162 A | 4/1989 | Roemer et al. ............... 324/309 |
| 4,857,846 A | 8/1989 | Carlson ........................ 324/309 |
| 5,208,534 A | 5/1993 | Okamoto et al. ............. 324/309 |
| 5,374,890 A | 12/1994 | Zou et al. ...................... 324/318 |
| 5,469,060 A | 11/1995 | Meyerand ..................... 324/309 |
| 5,587,656 A | 12/1996 | Van Heels-Bergen et al. |
| 5,910,728 A | 6/1999 | Sodickson .................... 324/309 |
| 6,289,232 B1 * | 9/2001 | Jacob et al. .................. 600/410 |
| 6,476,606 B2 * | 11/2002 | Lee ............................... 324/309 |
| 2002/0158632 A1 * | 10/2002 | Sodickson .................... 324/307 |
| 2003/0030437 A1 * | 2/2003 | Bydder et al. ................ 324/309 |

FOREIGN PATENT DOCUMENTS

| WO | WO 99/54746 | 10/1999 | |
| WO | WO 00/72034 A1 | 11/2000 | |
| WO | WO 00/72036 A1 | 11/2000 | ......... G01R/33/561 |

OTHER PUBLICATIONS

U.S. patent application Publication No. US 2001/0043068 A1, Publication Date: Nov. 22, 2001.

(List continued on next page.)

Primary Examiner—Christopher W. Fulton
Assistant Examiner—Tiffany A. Fetzner
(74) Attorney, Agent, or Firm—Wolf, Greenfield & Sacks, P.C.

(57) ABSTRACT

Advanced processing techniques can be used to enhance the robustness, efficiency, and quality of several parallel imaging techniques, such as SMASH, SENSE and subencoding. Specifically, a magnetic resonance image is formed by measuring RF signals in an array of RF coils, and tailoring a set of spatial harmonic functions to form a set of tailored spatial harmonics that are adjusted for variations in at least one of angulation of an image plane, field of view, and coil sensitivity calibration. The harmonics may be tailored by selecting automatically a subset of the set of spatial harmonic functions, adjusting the set of spatial harmonic functions by a function not equal to 1, to adjust for sensitivity variations along a phase encode direction, and/or performing separate spatial harmonic fits of the coil sensitivities at different spatial positions to the set of tailored spatial harmonics. The magnetic resonance image may also be formed by generating a set of encoding functions representative a spatial distribution of receiver coil sensitivities and spatial modulations corresponding to the gradient encoding steps, transforming the set of encoding functions to generate a new set of functions representative of distinct spatial positions in the image, and applying the new set of functions to a set of MR signals to form the magnetic resonance image. Matrices inverted during the process of forming the magnetic resonance image may be conditioned by thresholding the eigenvalues of the matrix prior to inversion.

28 Claims, 29 Drawing Sheets

OTHER PUBLICATIONS

Magnetic Resonance in Medicine 42:952–962 (1999), Klaas P Pruessmann et al "SFNSF Sensitivity Encoding For Fast MRI".

International Search Report from PCT application No. PCT/US01/07728.

Sodickson D.K., et al. "Simultaneous Acquisitions of Spatial Harmonics (SMASH) Fast Imaging With Radiofrequency Coil Arrays" Magnetic Resonance in Medicient, Academic Press, Duluth, MN, US, vol. 38, No. 4, Oct. 1, 1997, pp. 591–603.

Sodickson D.K. et al. "Accelerated Coronary MRA in Volunteers and Patients Using Double–Obliquie 3D Acquisitions With SMASH Reconstruction" Proceedings of the International Society For Magnetic Resonance in Medicine, Seventh Scientific Meeting and Exhibition, vol. 2, May 22, 1999, p. 1249.

Sodickson D.K. "Tailored SMASH image reconstruction for robust in vivo parallel MR imaging", Magnetic Resonance in Medicine, Aug. 2000, Wiley, USA, vol. 44, No. 2, pp. 243–251.

Kyriakos W.E. et al. "Sensitivity Profiles From An Array of Coils for Encoding and Reconstruction in Parallel (Space RIP)" Magnetic Resonance in Medicine, Academic Press, Duluth, MN, US, vol. 44, No. 2, Aug. 2000, pp. 301–308.

Sodickson D.K. "A Generalized Basis Approach to Spatial Encoding with Coil Arrays: SMASH–SENSE Hybrids and Improved Parallel MRI at High Accelerations" Proceedings of the International Society for Magnetic Resonance in Medicine, Eighth Scientific Meeting and Exhibition, vol. 1, Apr. 1, 2000, p. 272.

Ra J.B. et al. "Fast Imaging Using Subencoding Data Sets from Multiple Detectors" Magnetic Resonance in Medicient, Academic Press, Duluth, MN, US, vol. 30, No. 1, Jul. 1, 1993, pp. 142–145.

"Signal–to–Noise Ratio and Signal–to–Noise Efficiency in SMASH Imaging", Daniel K. Sodickson, et al., Magnetic Resonance in Medicine 41:1009–1022 (1999).

"Smash Imaging", Daniel K. Sodickson, et al., New Techniques in Body MR Imaging, 1064–9689/99, vol. 7, No. 2, May 1999, pp. 237–254.

* cited by examiner

CONSTANT cosKyY sinKyY cos2KyY sin2KyY $m = (1\ 0)$  $m = (1\ -0)$

SMASH Image      Sensitivity reference

PARALLEL MAGNETIC RESONANCE IMAGING TECHNIQUES USING RADIOFREQUENCY COIL ARRAYS

Partial support for this work was provided by the National Heart, Lung, and Blood Institute of the National Institutes of Health (NIH grant #r29-h160802).

FIELD OF THE INVENTION

This invention relates to magnetic resonance imaging and, more particularly, to a method and corresponding apparatus for capturing and providing MRI data suitable for use in a multi-dimensional imaging processes.

BACKGROUND OF THE INVENTION

Magnetic resonance imaging (MRI) is a well known method of non-invasively obtaining images representative of internal physiological structures. In fact, there are many commercially available approaches and there have been numerous publications describing various approaches to MRI. Although MRI will be described herein as applying to a person's body, it may be applied to visualize the internal structure of other objects as well, and the invention is not limited to application of MRI in a human body.

A conventional MRI system is schematically illustrated in FIG. 1. As shown in FIG. 1, an MRI system 10 includes a static magnet assembly, gradient coils, and transmit RF coils collectively denoted 12 under control of a processor 14, which typically communicates with an operator via a conventional keyboard/control workstation 16. These devices generally employ a system of multiple processors for carrying out specialized timing and other functions in the MRI system 10. Accordingly, as depicted in FIG. 1, an MRI image processor 18 receives digitized data representing radio frequency nuclear magnetic resonance responses from an object region under examination and, typically via multiple Fourier transformation processes well-known in the art, calculates a digitized visual image (e.g., a two-dimensional array of picture elements or pixels, each of which may have different gradations of gray values or color values, or the like) which is then conventionally displayed, or printed out, on a display 18a.

A plurality of surface coils 20a, 20b . . . 20i may be provided to simultaneously acquire NMR signals for simultaneous signal reception, along with corresponding signal processing and digitizing channels.

A conventional MRI device establishes a homogenous magnetic field, for example, along an axis of a person's body that is to undergo MRI. This magnetic field conditions the interior of the person's body for imaging by aligning the nuclear spins of nuclei, in atoms and molecules forming the body tissue, along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of a radiofrequency (RF)—pulses. During the realignment process, the nuclei precess about the axis of the magnet field and emit electromagnetic signals that may be detected by one or more coils placed on or about the person.

It is known that the frequency of the nuclear magnetic radiation (NMR) signal emitted by a given precessing nucleus depends on the strength of the magnetic field at the nucleus' location. Thus, as is well known in the art, it is possible to distinguish radiation originating from different locations within the person's body simply by applying a field gradient to the magnetic field across the person's body. For sake of convenience, this will be referred to as the left-to-right direction. Radiation of a particular frequency can be assumed to originate at a given position within the field gradient, and hence at a given left-to-right position within the person's body. Application of a such a field gradient is referred to herein as frequency encoding.

The simple application of a field gradient does not allow two dimensional resolution, however, since all nuclei at a given left-to-right position experience the same field strength, and hence emit radiation of the same frequency. Accordingly, application of a frequency-encoding gradient, alone, does not make it possible to discern radiation originating from the top vs. radiation originating from the bottom of the person at a given left-to-right position. Resolution has been found to be possible in this second direction by application of gradients of varied strength in a perpendicular direction to thereby perturb the nuclei in varied amounts. Application of such additional gradients is referred to herein as phase encoding.

Frequency-encoded data sensed by the coils during a phase encoding step is stored as a line of data in a data matrix known as the k-space matrix. Multiple phase encoding steps must be performed to fill the multiple lines of the k-space matrix. An image may be generated from this matrix by performing a Fourier transformation of the matrix to convert this frequency information to spatial information representing the distribution of nuclear spins or density of nuclei of the image material.

MRI has proven to be a valuable clinical diagnostic tool for a wide range of organ systems and pathophysiologic processes. Both anatomic and functional information can be gleaned from the data, and new applications continue to develop as the technology and techniques for filling the k-space matrix improve. As technological advances have improved achievable spatial resolution, for example, increasingly finer anatomic details have been able to be imaged and evaluated using MRI.

Often, however, there is a tradeoff between spatial resolution and imaging time, since higher resolution images require a longer acquisition time. This balance between spatial and temporal resolution is particularly important in cardiac MRI, where fine details of coronary artery anatomy, for example, must be discerned on the surface of a rapidly beating heart. A high-resolution image acquired over a large fraction of the cardiac cycle will be blurred and distorted by bulk cardiac motion, whereas a very fast image may not have the resolution necessary to trace the course and patency of coronary arteries.

Imaging time is largely a factor of the speed with which the MRI device can fill the k-space matrix. In conventional MRI, the k-space matrix is filled one line at a time. Although many improvements have been made in this general area, the speed with which the k-space matrix may be filled is limited by, e.g., the intervals necessary to create, switch or measure the magnetic fields or RF signals involved in data acquisition, as well as physiological limits on the maximum strength and variation of magnetic fields and RF signals the human body is able to withstand.

To overcome these inherent limits, several techniques have been developed to simultaneously acquire multiple lines of data for each application of a magnetic field gradient. These techniques, which may collectively be characterized as "parallel imaging techniques," use spatial information from arrays of RF detector coils to substitute for encoding which would otherwise have to be obtained in a sequential fashion using field gradients and RF pulses. The use of multiple effective detectors has been shown to multiply imaging speed, without increasing gradient switching rates or RF power deposition.

The first in vivo images using the parallel MR imaging approach were obtained using the SMASH (SiMultaneous Acquisition of Spatial Harmonics) technique. The history of parallel imaging in general and of the SMASH technique in particular is described in greater detail in U.S. Pat. No. 5,910,728, the content of which is hereby incorporated by reference. An alternative strategy for parallel imaging, known as "subencoding", had been described earlier using phantom images only. A technique closely related to subencoding—the SENSE (SENSitivity Encoding) technique—has recently been described and applied to in vivo imaging. The SENSE technique is discussed in more detail in International Publication Number WO 99/54746, the content of which is hereby incorporated by reference.

Parallel imaging techniques have tended to fall into one of two general categories, as exemplified by the SMASH and the subencoding/SENSE methods, respectively. SMASH operates primarily on the k-space matrix and is referred to herein as operating in "k-space." Subencoding/SENSE, by contrast, operate primarily on data that has been transformed via one or more Fourier transforms into image data, and will be referred to herein as operating in the "image domain."

SMASH

SMASH uses spatial information from an array of RF coils to obtain one or more lines of k-space data traditionally generated using magnetic field gradients, thereby allowing multiple phase encoding steps to be performed in parallel rather than in a strictly sequential fashion. To date, this parallel data acquisition strategy has resulted in up to five-fold accelerations of imaging speed and efficiency in vivo, and has enabled up to eight-fold accelerations in phantoms using specialized hardware.

SMASH is based on the principle that combinations of signals from component coils in an array may be formed to mimic the sinusoidal spatial modulations (or "spatial harmonics") imposed by field gradients, and that these combinations may be used to take the place of time-consuming gradient steps. Spatial harmonic fitting is a fundamental step in SMASH image reconstructions. This fitting procedure is designed to yield the linear combinations of coil sensitivity functions $C_l(x,y)$ which most closely approximate various spatial harmonics of the field of view (FOV):

$$\sum_{l=1}^{L} n_l^{(m)} C_l(x, y) \approx C_0 \exp(im\Delta k_y y) \quad (1)$$

Here, m is an integer indicating the order of the spatial harmonic, l is a coil index running from 1 to the number of coils L, $n_l^{(m)}$ are complex fitting coefficients, and $\Delta k_y = 2\pi/$FOV.

FIGS. 2 and 3 demonstrate the spatial harmonic fitting procedure schematically for a set of eight rectangular coils 20a, 20b. . . 20h laid end-to-end, with a slight overlap. As shown in FIG. 3a, each coil 20a, 20b . . . has a sensitivity curve a, b . . . which rises to a broad peak directly under the coil and drops off substantially beyond the coil perimeter. The sum of the coil sensitivities form a relatively constant sensitivity, over the width of the array, corresponding to the zero$^{th}$ spatial harmonic. FIGS. 3a–3e illustrate recombinations of different ones of these individual offset but otherwise similar coil sensitivity functions into a new synthetic sinusoidal spatial sensitivity. Different weightings of the individual component coil sensitivities lead to net sensitivity profiles approximating several spatial harmonics. Coil sensitivities (modeled schematically for FIGS. 3a–3e as Gaussian in shape, though in practice their shapes are somewhat more complicated and they may have both real and imaginary components) may thereby be combined to produce harmonics at various fractions of the fundamental spatial wavelength $\lambda_y = 2\pi/K_y$, with $\lambda_y$ being on the order of the total coil array extent in y. Weighted individual coil sensitivity profiles are depicted as thin solid lines beneath each component coil. Dashed lines represent the sinusoidal or consinusoidal weighting functions. Combined sensitivity profiles are indicated by thick solid lines. These combined profiles closely approximate ideal spatial harmonics across the array. A total of five spatial harmonics are shown here, but in general the maximum number of such independent combinations which may be formed for any given array is equal to the number of array elements (in this case, eight).

Once fitting coefficients satisfying Eq. (1) have been identified, a similar weighting of measured MR signals $S_l(k_x, k_y)$ from an image plane with spin density $\rho(x,y)$ yields composite signals shifted by an amount $-m\Delta k_y$ in k-space:

$$\begin{aligned}
\sum_{l=1}^{L} n_l^{(m)} S_l(k_x, k_y) &= \sum_{l=1}^{L} n_l^{(m)} \int\int dx\,dy\, C_l(x, y)\rho(x, y)\exp(-ik_x x, -ik_y y) \\
&= \int\int dx\,dy \left(\sum_{l=1}^{L} n_l^{(m)} C_l(x, y)\right) \rho(x, y)\exp(-ik_x x, -ik_y) \\
&\approx \int\int dx\,dy\, C_0 \exp(im\Delta k_y y) \rho(x, y)\exp(-ik_x x, -ik_y y) \\
&= \int\int dx\,dy\, C_0 \rho(x, y)\exp(-ik_x x, -i(k_y - m\Delta k_y)y) \\
&= S^{composite}(k_x, k_y - m\Delta k_y)
\end{aligned} \quad (2)$$

This k-space shift has precisely the same form as the phase-encoding shift produced by evolution in a field gradient of magnitude $\gamma Gt = -m\Delta k_y$ (where y is the gyromagnetic ratio, G the magnitude of the gradient, and t the time spent in the gradient). Thus, the coil-encoded composite signals may be used to take the place of omitted gradient steps, thereby reducing the data acquisition time by multiplying the amount of spatial information gleaned from each phase encoding step. SMASH takes its cue from the physical model of gradient phase encoding, transforming the localized coil sensitivities into extended composite phase modulations (Eq.(1)) which can serve as supplementary effective gradient sets operating in tandem with the applied field gradients.

Several of the steps in the SMASH reconstruction procedure are summarized in FIGS. 4a–4c and 5a–5c, which illustrate a SMASH reconstruction with acceleration factor M=2 using a 3-element RF coil array. FIGS. 4a–4c show a k-space schematic, and FIGS. 5a–5c show image data from a water phantom at each of the corresponding stages of reconstruction. With the necessary weights in hand, MR signal data are acquired simultaneously in the coils of the array. A fraction 1/M of the usual number of phase encoding steps are applied, with M times the usual spacing in k-space (FIG. 4a). The component coil signals acquired in this way correspond to aliased images with a fraction 1/M of the desired field of view (FIG. 5a). With 1/M times fewer phase encoding steps, only a fraction 1/M of the time usually required for this FOV is spent on data collection. Next, the appropriate M linear combinations of the component coil signals are formed, to produce M shifted composite signal data sets (FIG. 4b). The composite signals are then interleaved to yield the full k-space matrix (FIG. 4c), which is Fourier transformed to give the reconstructed image (FIG. 5c, right). It should be noted that the combination of component coil signals into composite shifted signals may be performed in real time as the data arrives, or after the fact via postprocessing as is appropriate or convenient with the apparatus and the calibration information at hand.

Image Domain Techniques

As discussed above, SMASH is one member of a family of parallel imaging techniques including subencoding and SENSE.

The subencoding image reconstruction begins at the same starting point as a SMASH reconstruction—namely, with a set of component coil signals acquired using a reduced number of phase encoding gradient steps. Fourier transformation of these signal sets results in aliased component coil images like those shown in FIG. 5a. From that point on, the subencoding reconstruction operates entirely in the image domain, by combining individual pixel data in each of the aliased component coil images to extract an unaliased full-FOV image.

The basis of the technique lies in the fact that each pixel in an aliased image is in fact a superposition of multiple pixels from a corresponding full unaliased image (FIG. 5). In other words, as a result of Nyquist aliasing, an M-times aliased image $I^{fold}$ is related to the putative full image $I^{full}$ as follows:

$$I^{fold}(x, y) = I^{full}(x, y) + I^{full}(x, y + \Delta y) + I^{full}(x, y + 2\Delta y) + \cdots = \sum_{m=0}^{M-1} I^{full}(x, y + m\Delta y) \quad (3)$$

When $I^{fold}$ is acquired using a single coil, this superposition cannot be "unfolded" without a priori knowledge of the full image.

The situation changes when an array of coils is used. The full image $I_l^{full}$ in each coil l is actually made up of two pieces—the spin density $\rho$, and the coil sensitivity function $C_l$:

$$I_l^{full}(x,y) = C_l(x,y)\rho(x,y) \quad (4)$$

and in an array, each component coil l has a different sensitivity $C_l$. Thus, each coil presents one of multiple "views" of the aliasing, which can be used to deduce just how much of each aliased pixel belongs at any position in the full image. Substituting Eq. (4) into Eq. (3) gives $$I_l^{fold}(x, y) = \sum_{m=0}^{M-1} I_l^{full}(x, y + m\Delta y) = \sum_{m=0}^{M-1} C_l(x, y + m\Delta y)\rho(x, y + m\Delta y) \quad (5)$$

where $\Delta y = FOV_y/M$. For any particular aliased pixel (x,y), this may be written as follows:

$$I_l^{fold} = \sum_{m=0}^{M-1} I_{lm}^{full} = \sum_{m=0}^{M-1} C_{lm}\rho_m \quad (6)$$

where $I_{lm}^{full} \equiv I_l^{full}(x,y+m\Delta y)$, $C_{lm} \equiv C_l(x,y+m\Delta y)$, and $\rho_m \equiv \rho(x,y+m\Delta y)$.

For example, in a four-coil array, using a factor of three aliasing (FIG. 6):

$$I_1^{fold} = C_{11}\rho_1 + C_{12}\rho_2 + C_{13}\rho_3$$

$$I_2^{fold} = C_{21}\rho_1 + C_{22}\rho_2 + C_{23}\rho_3 \quad (7)$$

$$I_3^{fold} = C_{31}\rho_1 + C_{32}\rho_2 + C_{33}\rho_3$$

$$I_4^{fold} = C_{41}\rho_1 + C_{42}\rho_2 + C_{43}\rho_3$$

This equation may be rewritten in matrix form as $$\begin{bmatrix} I_1^{fold} \\ I_2^{fold} \\ I_3^{fold} \\ I_4^{fold} \end{bmatrix} = \begin{bmatrix} C_{11} & C_{12} & C_{13} \\ C_{21} & C_{22} & C_{23} \\ C_{31} & C_{32} & C_{33} \\ C_{41} & C_{42} & C_{43} \end{bmatrix} \cdot \begin{bmatrix} \rho_1 \\ \rho_2 \\ \rho_3 \end{bmatrix} \quad (8)$$

or, in other words, $$I^{fold} = C \cdot \rho \quad (9)$$

As long as the number of coils $N_c$ is greater than or equal to the aliasing factor M (as in our exemplary case for which $N_c=4$, M=3), Eq. (9) may be inverted:

$$\rho = C^{-1} \cdot I^{fold} \quad (10)$$

and the unaliased spin density $\rho$ over the full FOV may be determined.

SENSE uses an image reconstruction procedure similar to the image domain subencoding reconstruction. The SENSE technique also incorporates an in vivo sensitivity calibration method in which full-FOV component coil images are divided by an additional full-FOV body coil image, and the quotient images are then subjected to several stages of interpolation, filtering, and thresholding.

Limitations of Conventional Parallel Imaging Techniques

All parallel MR imaging techniques use spatial information from coil arrays to perform spatial encoding, and all require knowledge of component coil sensitivity information. Each technique has a different susceptibility to noise and/or to systematic errors in the measured sensitivity information. The physical model underlying SMASH aligns naturally with the hardware and software of a gradient-encoded MR acquisition, and the spatial harmonic fitting procedure provides a degree of noise smoothing and numerical conditioning which may be particularly important at high acceleration factors. These advantages come at the expense of introducing the approximation in Eq. (1).

The SMASH image reconstruction procedure, as described above and as described more fully in U.S. Pat. No. 5,910,728, has several potential limitations, especially where it is necessary to fit spatial harmonics to highly oblique and double oblique image planes. Since clinical imaging requires flexible image plane selection, some improvements to the basic SMASH reconstruction procedure have been called for in the course of clinical implementation.

The subencoding and SENSE image reconstruction procedure also has a number of potential limitations. It can suffer from numerical instabilities, especially when the component coil sensitivities are either insufficiently well characterized or insufficiently distinct from one another. These instabilities may manifest as localized artifacts in the reconstructed image, or may result in degraded signal to noise ratio (SNR). SENSE, in particular, conventionally requires the acquisition of additional sensitivity reference data in a coil with uniform sensitivity such as a body coil (which typically encircles the entire patient in the magnet bore). This additional reference data is used as a control for the measured sensitivities in the coil array. However, acquisition of this additional reference data, not required in SMASH, can add to the total MR examination time, and appropriate correction for this reference in the SENSE reconstruction can lengthen image reconstruction times and complicate the reconstruction algorithm. Furthermore, even with use of the body coil reference in SENSE, regions of low reference signal can result in image artifacts and miscalibrations.

SUMMARY OF THE INVENTION

The overall flexibility of SMASH image reconstructions is improved by taking advantage of various degrees of freedom in the fitting of coil sensitivities to spatial harmonics which forms the basis of the SMASH technique. Further improvements are achieved by adding numerical conditioning methods to the spatial harmonic fit, so as to bias the reconstruction towards higher SNR.

Image domain techniques are also improved by the addition of numerical conditioning. This conditioning, in combination with some additional modifications eliminates the need to acquire a body coil reference, and facilitates the treatment of regions with low intrinsic sensitivity.

Hybrid parallel imaging techniques are also described. These hybrid techniques combine some of the features and advantages of both the k-space and the image domain approaches.

According to one embodiment of the invention, a magnetic resonance image is formed by measuring RF signals in an array of RF coils, forming a set of spatial harmonics and tailoring the set of spatial harmonics to form a set of tailored spatial harmonics that are adjusted for variations in angulation of the image plane, the field of view, or the coil sensitivity calibration. In this embodiment, the coil calibration coefficients are determined by performing a spatial harmonic fit of the coil spatial sensitivities to the set of tailored spatial harmonics, and applying the determined coil calibration coefficients to the measured RF signals to form multiple lines of k-space data. The multiple lines of the k-space data are then transformed to form the MRI image.

The spatial harmonics may be tailored in a number of ways. For example, the spatial harmonics may be tailored by selecting automatically a subset of the set of formed spatial harmonics, by adjusting the set of spatial harmonics by a function not equal to 1, to adjust for sensitivity variations along a phase encode direction, and/or by performing separate spatial harmonic fits of the coil sensitivities at different spatial positions to the set of tailored spatial harmonics.

The magnetic resonance image may further be formed by adjusting each coil spatial sensitivity by a function not equal to 1, and adjusting the spatial harmonics by the same function. This function may represent the differences between component coil images, such that the importance of features shared by all component coils is minimized. Thus, in vivo sensitivity references may be used to form the magnetic resonance image.

According to another embodiment of the invention, a magnetic resonance image is formed from an array of receiving coils having distinct spatial sensitivities by forming a sensitivity matrix representing measured coil sensitivities, conditioning the sensitivity matrix, and using the conditioned sensitivity matrix during a reconstruction on signals provided by the receiving coils to form a MRI image.

In this embodiment, the sensitivity matrix may be conditioned by adding artificial orthogonal interferants to prevent generation of unduly large weights resulting from small eigenvalues in the sensitivity matrix. The eigenvalues also may be conditioned by determining eigenvalues of the sensitivity matrix and setting all eigenvalues below a threshold to a particular value, eliminating all eigenvalues below the threshold, or adding the threshold value to all eigenvalues.

According to another embodiment of the invention, a magnetic resonance image is formed from an array of receiving coils having unique spatial sensitivities by obtaining a reference image set, conditioning the reference image set, measuring RF signals indicative of nuclear spins simultaneously in each of the plurality of RF receiving coils, performing a Fourier transform on the signals from each coil to form aliased component coil image data signals, unaliasing the image data signals using the reference image set to form reconstructed component coil images, and combining the reconstructed component coil images.

According to another embodiment of the invention, a magnetic resonance image is formed from an array of receiving coils having unique spatial sensitivities by measuring MR signals indicative of nuclear spins in the plurality of receiver coils to form a set of MR signals, generating a set of encoding functions representative of a combination of spatial distributions of receiver coil sensitivities with spatial modulations corresponding to the gradient encoding steps, transforming the set of encoding functions to generate a new set of functions representative of distinct spatial positions in an image, and applying the new set of functions to the set of MR signals to form the magnetic resonance image.

According to another embodiment of the invention, a magnetic resonance image is formed from an array of receiving coils having unique spatial sensitivity by forming an encoding matrix, each entry of the encoding matrix including a coil sensitivity of a respective coil combined with a gradient modulation corresponding to a particular gradient encoding step, inverting the encoding matrix to form an inverted encoding matrix, forming a k-space matrix, each entry of the k-space matrix including a measured RF signal indicative of nuclear spins sensed by a respective coil at a particular gradient encoding step, and multiplying the inverted encoding matrix with the k-space matrix to form the magnetic resonance image. The encoding matrix may be inverted in sub-blocks, and these sub-blocks may be used to form the magnetic resonance image.

BRIEF DESCRIPTION OF THE FIGURES

This invention is pointed out with particularity in the appended claims. The above and further advantages of this invention may be better understood by referring to the following description when taken in conjunction with the accompanying drawings. The accompanying drawings are not intended to be drawn to scale. In the drawings, each identical or nearly identical component that is illustrated in various figures is represented by a like numeral. For purposes of clarity, not every component may be labeled in every drawing. In the drawings:

DETAILED DESCRIPTION OF THE INVENTION

There are several aspects to the invention, each of which provides flexibility to the process of reconstructing an MRI image. These aspects are discussed below as relating to improvements to SMASH, improvements to image domain techniques, and as hybrid parallel imaging techniques. All of these improvements may be implemented in a computer system forming a control and acquisition device for a MRI system 10, such as in the system illustrated in FIG. 24.

Figure 24:
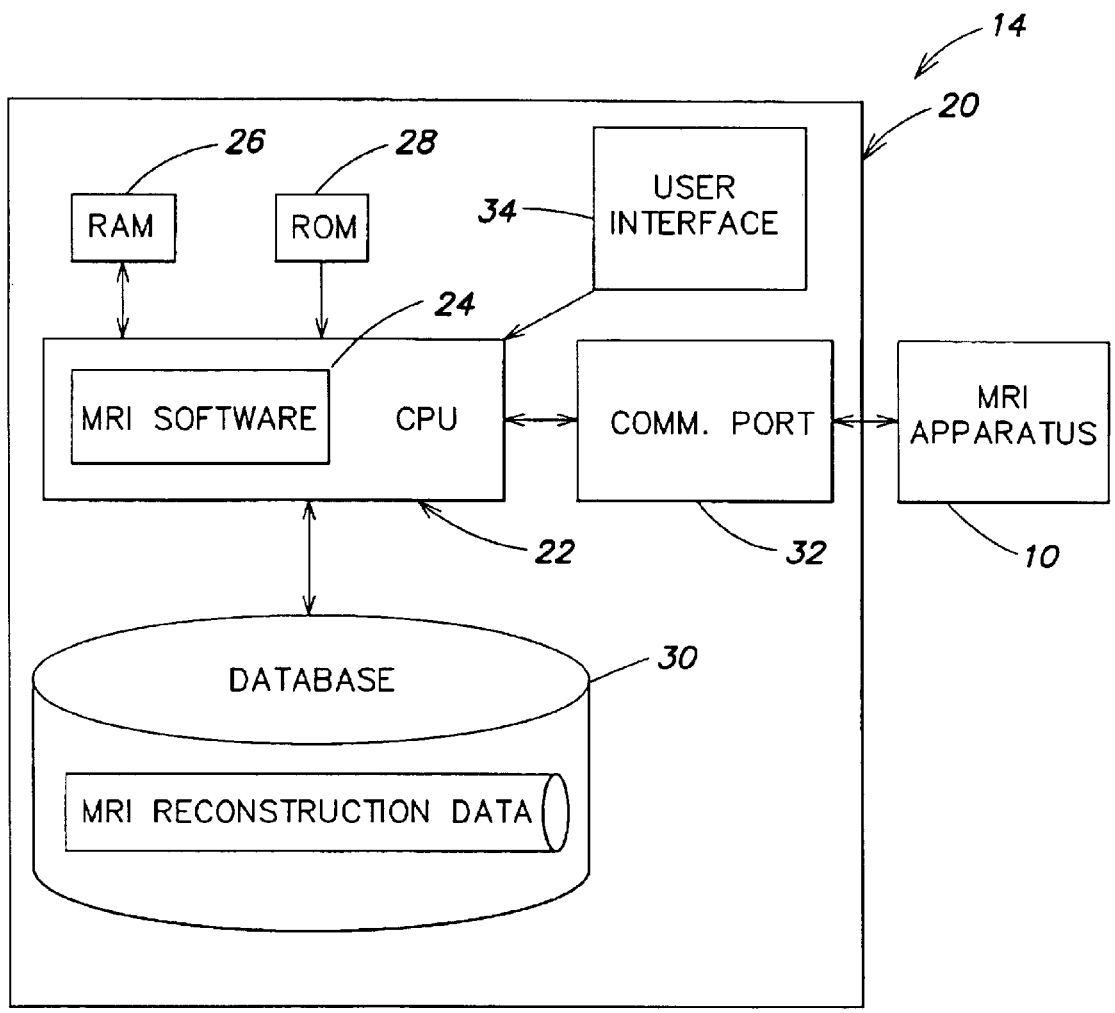
FIG. 24 is a functional block diagram of a computer system for use with the MRI apparatus of FIG. 1.

As shown in FIG. 24, in one embodiment, the computer system includes a computer program, MRI software 24, running on a computer 20 or group of computers configured to receive input from the coil arrays 12 via a communication port 32 and to enable parallel image reconstructions to be performed. The computer, in this instance, may be configured to run autonomously to create parallel image reconstructions (without the intervention of a human operator), or may require intervention or direction for all, a selected subset, or particular classes of reconstructions. The invention is not limited to the disclosed embodiments, and may take on many different forms depending on the particular requirements of the MRI apparatus 10 and the type of computer equipment employed.

Figure 1:
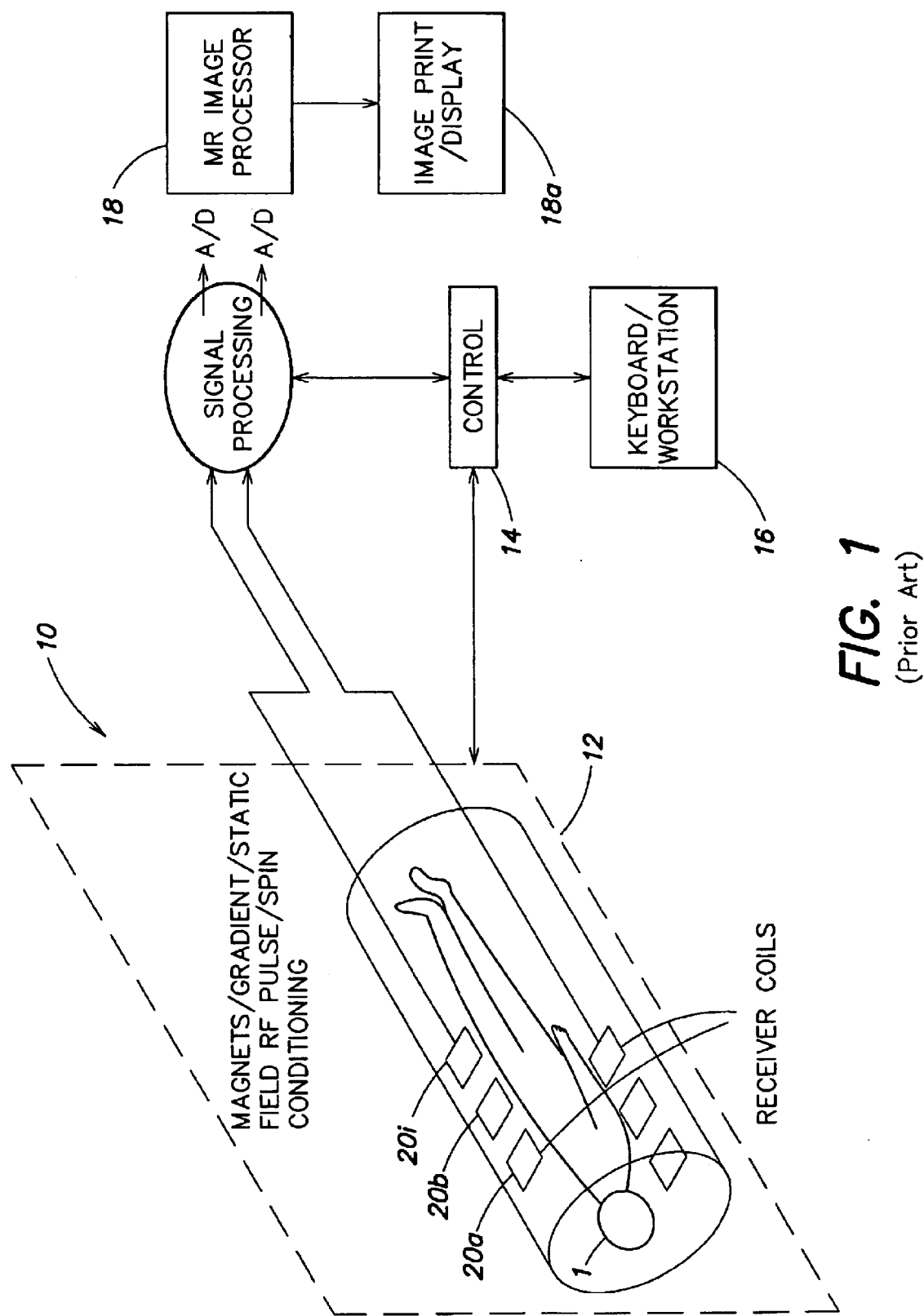
FIG. 1 is a schematic illustration of a conventional MRI system.
Figure 2:
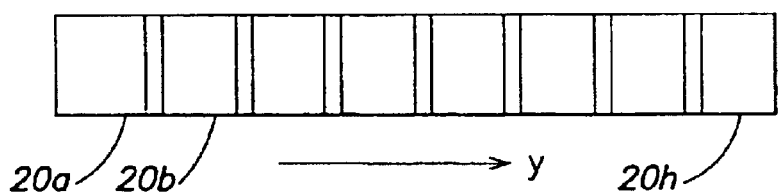
FIG. 2 is a schematic illustration of an eight-coil array.
Figure 3A:
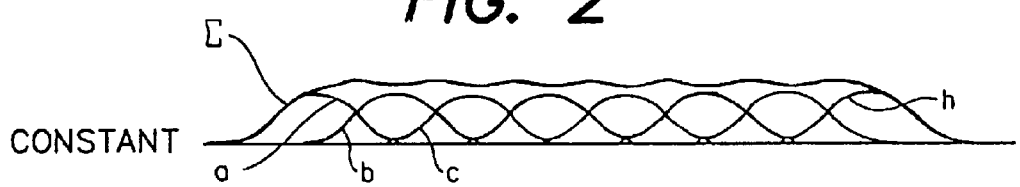
FIGS. 3a–3e represent recombinations of coil sensitivity functions to form sinusoidal spatial sensitivity functions.
Figure 3B:
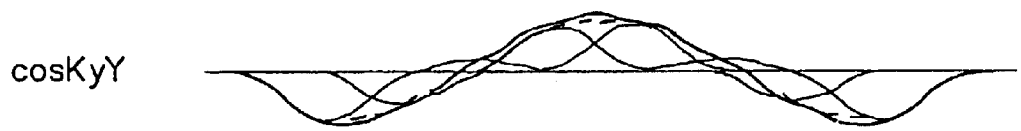
Figure 3C:
Figure 3D:
Figure 3E:
Figure 4A:
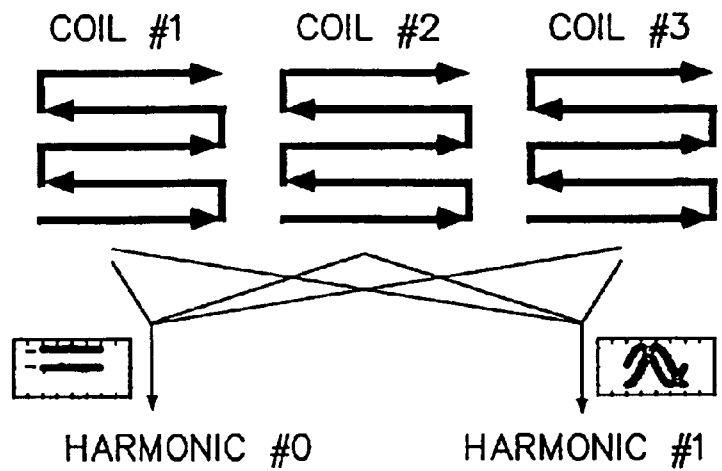
FIGS. 4a–4c are schematic representations of the SMASH reconstruction procedure.
Figure 4B:
Figure 4C:
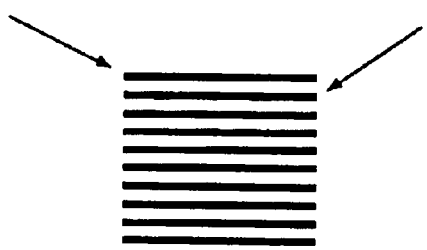
Figure 5:
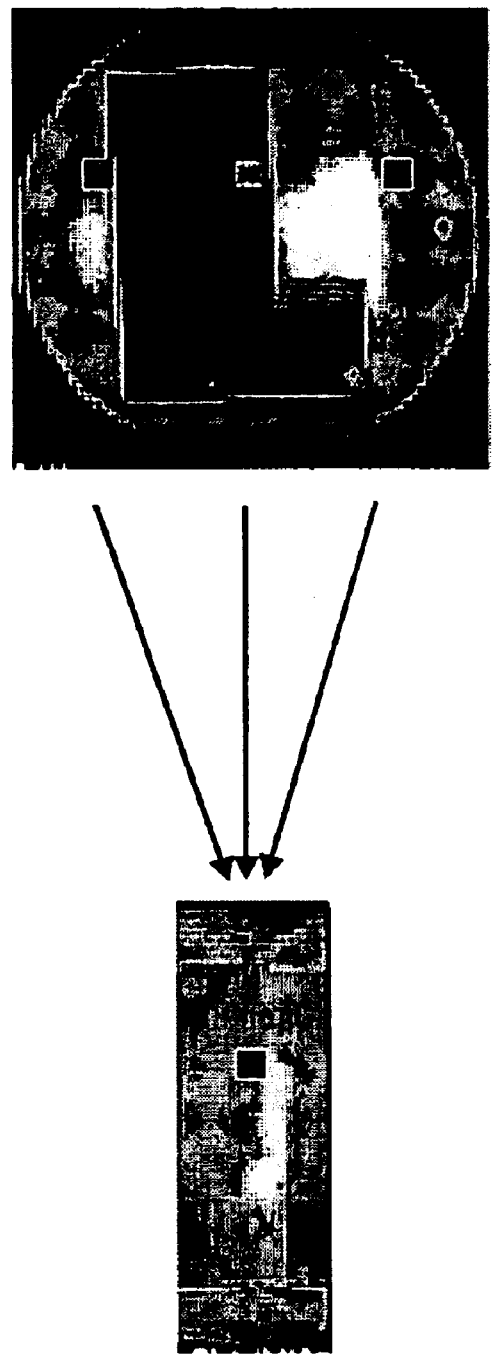
FIG. 5 shows superposition of pixels (white squares) in an aliased image.
Figure 5A:
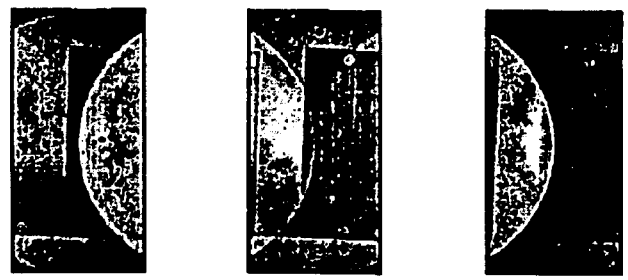
FIGS. 5a–5c are images corresponding, respectively to FIGS. 4a–4c, as explained in the test.
Figure 5B:
Figure 5C:
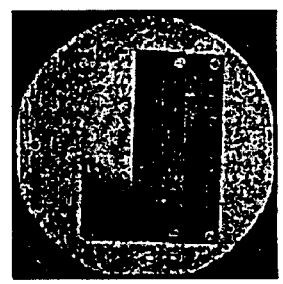
Figure 6:
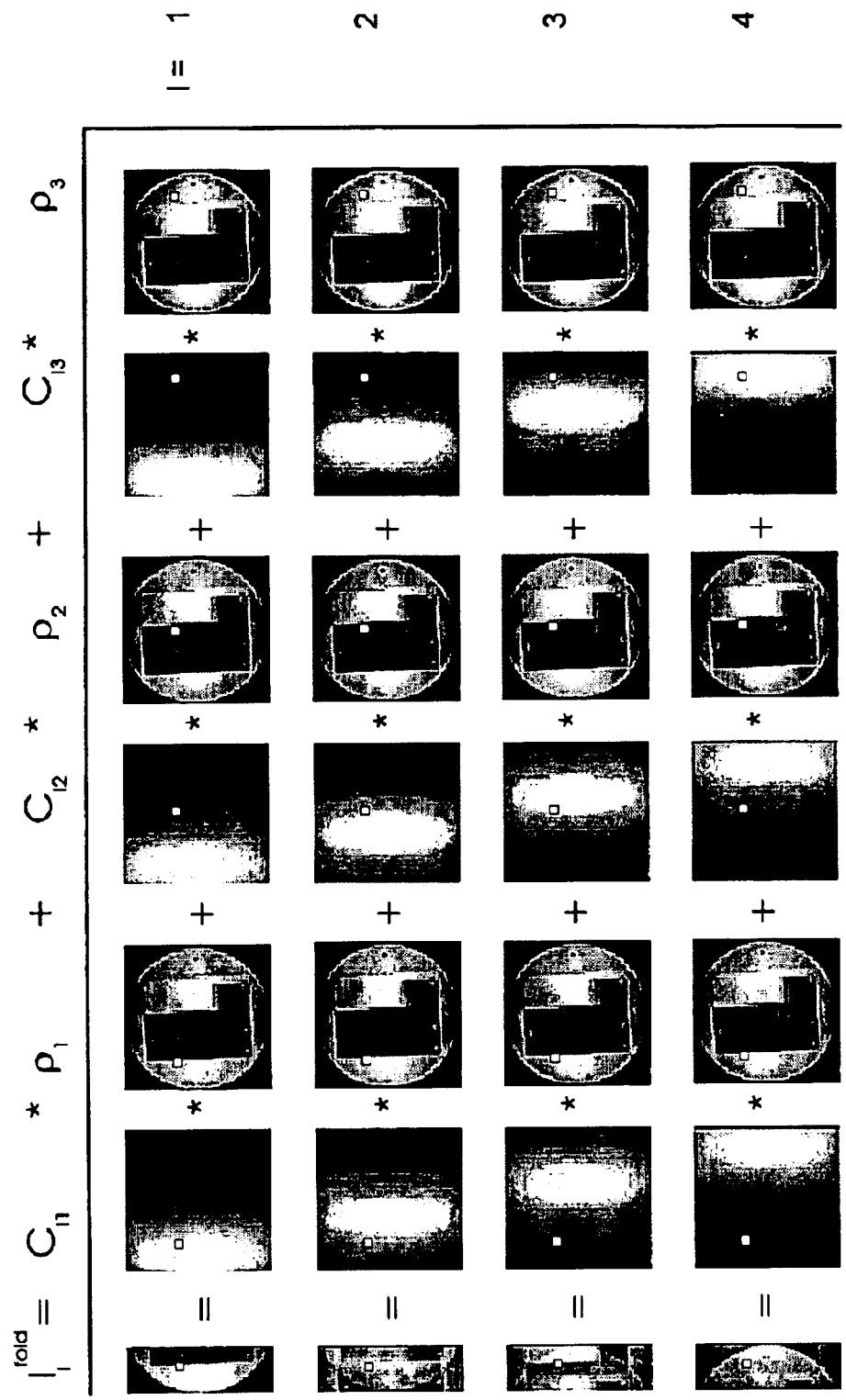
FIG. 6 shows superposition of pixels (white squares) in an aliased or subencoded image set from an array of coils.

The computer system, may optionally, but need not necessarily, perform additional functions, including controlling the MRI coils to alter the magnetic fields, controlling RF pulses generated during the MRI procedure, and any other functions commonly performed by a computer 20 associated with the MRI apparatus 10. For example, in one embodiment, the computer system performs the functions of the control 14, keyboard workstation 16, MR image processor 18 and image print/display 18a of FIG. 1.

In the embodiment shown in FIG. 24, the computer system configured to implement the methods of reconstructing images discussed below includes at least one main unit 20 connected to the MRI apparatus 10. The main unit 20 may include a processor (CPU 22) running the MRI software 24 and may be connected to a memory system including various memory devices, such as random access memory RAM 26, read only memory ROM 28, and one or more databases 30.

The computer system may be a general purpose computer system which is programmable using a computer programming language, such as C, C++, Java, or other language, such as a scripting language or even assembly language. The computer system may also be specially programmed, special purpose hardware, or an application specific integrated circuit (ASIC).

In a general purpose computer system, the processor is typically a commercially available microprocessor, such as Pentium series processor available from Intel, or other similar commercially available device. Such a microprocessor executes a program called an operating system, such as UNIX, Linux, Windows NT, Windows 95, 98, or 2000, or any other commercially available operating system, which controls the execution of other computer programs and provides scheduling, debugging, input/output control, accounting, compilation, storage assignment, data management, memory management, communication control and related services, and many other functions. The processor and operating system defines a computer platform for which application programs in high-level programming languages are written.

The database 30 may be any kind of database, including a relational database, object-oriented database, unstructured database, or other database. Example relational databases include Oracle 8I from Oracle Corporation of Redwood City, Calif.; Informix Dynamic Server from Informix Software, Inc. of Menlo Park, Calif.; DB2 from International Business Machines of Yorktown Heights, N.Y.; and Access from Microsoft Corporation of Redmond, Wash. An example object-oriented database is ObjectStore from Object Design of Burlington, Mass. An example unstructured database is Notes from the Lotus Corporation, of Cambridge, Mass. A database also may be constructed using a flat file system, for example by using files with character-delimited fields, such as in early versions of dBASE, now known as Visual dBASE from Inprise Corp. of Scotts Valley, Calif., formerly Borland International Corp. The database 30 is preferably capable of storing MRI reconstruction data, such as k-space image data or image domain data acquired from the MRI apparatus 10.

The main unit 20 may optionally include or be connected to an user interface 34 having one or more input and/or output devices. Example input devices include a keyboard, keypad, track ball, mouse, pen and tablet, communication device, and data input devices such as audio and video capture devices. Example output devices include cathode ray tube (CRT) displays, liquid crystal displays (LCD) and other video output devices, printers, communication devices such as modems, storage devices such as a disk or tape, and audio or video output devices. It should be understood that the invention is not limited to the particular input or output devices used in combination with the computer system or to those described herein.

It also should be understood that the invention is not limited to a particular computer platform, particular processor, or particular high-level programming language. Additionally, the computer system may be a multiprocessor computer system or may include multiple computers connected over a computer network. It should be understood further that each module or step shown in the accompanying figures and the substeps or subparts shown in the remaining figures may correspond to separate modules of a computer program, or may be separate computer programs. Optionally, such modules may be operable on separate computers. The data produced by these components may be stored in a memory system or transmitted between computer systems.

Such a system may be implemented in software, hardware, or firmware, or any combination thereof. The various elements of the method of creating MRI reconstructions disclosed herein, either individually or in combination, may be implemented as a computer program product, such as MRI software 24, tangibly embodied in a machine-readable storage device for execution by the computer processor 22. Various steps of the process may be performed by the computer processor 22 executing the MRI software 24 tangibly embodied on a computer-readable medium to perform functions by operating on input and generating output. Computer programming languages suitable for implementing such a system include procedural programming languages, object-oriented programming languages, and combinations of the two. One exemplary computer programming language is the Matlab programming language (The Mathworks, Natick, Mass., USA), although other computer languages may be used to implement the MRI software and to form MRI reconstructions as well.

As shown in FIG. 24, the MRI software 24 contains algorithms for execution by the CPU 22 that enables the CPU 22 to perform the methods set forth herein. These methods will now be described more fully in connection with FIGS. 5–24. The first section describes new techniques associated with k-space techniques, the second section describes new techniques that may be applied to image domain processes, and the third section presents a unifying view of both types of techniques and explains techniques useful to capture the benefits of both.

K-space Techniques

Applicant has found that there are several important degrees of freedom in the spatial harmonic fitting procedure underlying SMASH image reconstructions. Tailored reconstructions exploiting these degrees of freedom may be combined with numerical conditioning in a rational reconstruction approach which reduces artifacts, improves SNR, and allows convenient coil sensitivity mapping for high-quality SMASH image reconstructions in oblique or double-oblique image planes.

Tailored Fits

Tailored fitting procedures take advantage of degrees of freedom in the fit to adjust for variations in slice angulation, FOV, or coil sensitivity calibration. Several such procedures are described below. Tailored fits are thus designed to reduce residual artifacts in the reconstructions due to departures from perfect spatial harmonics.

Choice of Harmonics

One degree of freedom that the SMASH technique may exploit is the choice of target harmonic order m. Applicant has found that in certain situations, reconstructing an MRI image from a particular set of harmonics yields a better image than reconstructing the same MRI image from a different set of harmonics. Thus, Applicant discovered, the 'reference' harmonic need not be m=0, and the harmonic orders need not even be integral, so long as the target harmonics are spaced in such a way as to replace the missing gradient-encoded k-space lines. For example, for a simple two-fold acceleration, typical choices might include m={0, 1} or m={−1,0}. For a three-fold acceleration, one might choose m={0,1,2}, m={−1,0,1}, or m={−2,−1,0}. If a general harmonic set m={n,n+1,n+2, . . . } is selected, the intensity profile of the resulting SMASH-reconstructed image is modulated by an overall phase variation $\exp(-in\Delta k_y y)$, which may be eliminated by a simple absolute magnitude operation.

To determine the optimal set of spatial harmonics, the harmonics may be chosen to match the harmonic content of component coil sensitivity profiles for particular coil configurations. Since coil sensitivities tend to vary relatively slowly over most typical fields of view, low harmonic orders are, as a general rule, easier to fit than high harmonic orders. For this reason, target harmonic sets approximately centered around m=0 are typically used. For array directions parallel to the main magnetic field $B_0$, positive and negative harmonic orders are roughly equivalent, at least for portions of the FOV near the centerline of the coil array. For array directions perpendicular to the $B_0$ field direction, there is often a bias towards one sign or the other, due primarily to the inherent phase variation of coil sensitivities along the array axis in this orientation.

Figure 7A:
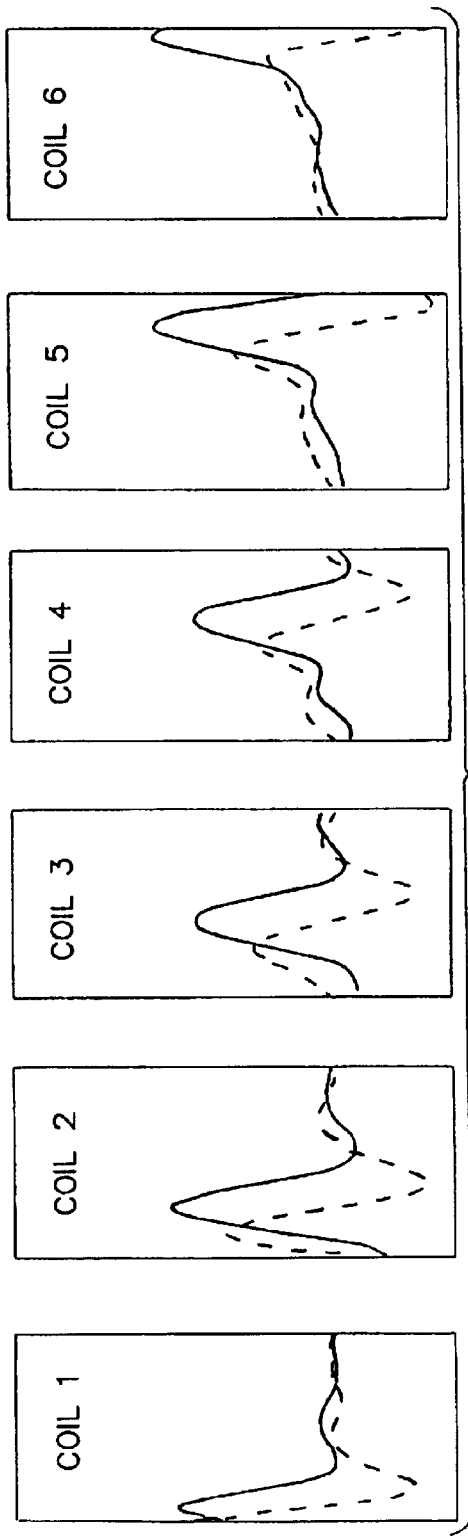
FIGS. 7a–7d demonstrate the effect of harmonic choice upon the quality of the spatial harmonic fit and of the resulting SMASH image.
Figure 7B:
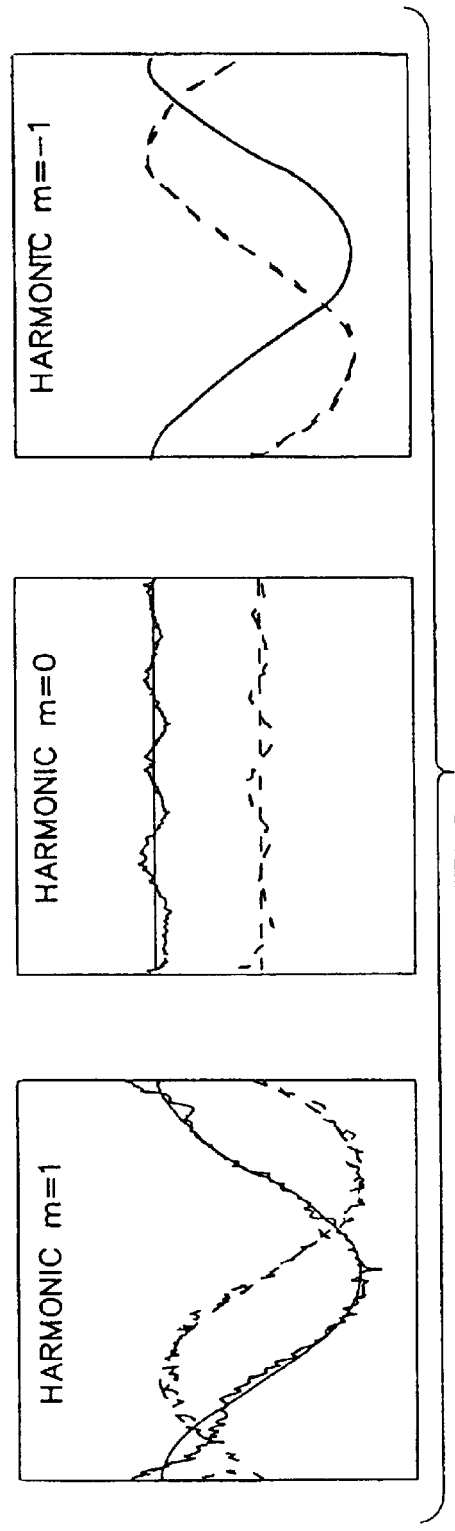
Figure 7C:
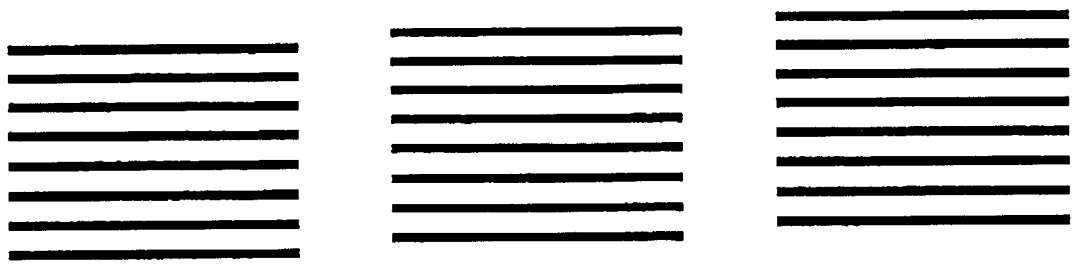
Figure 7D:
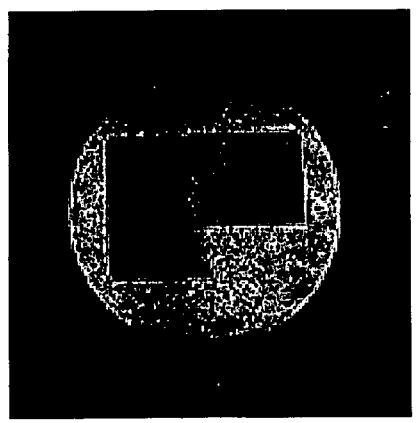
Figure 7D:
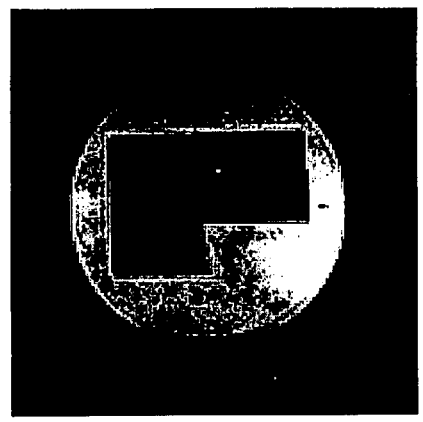

FIGS. 7a–7d demonstrate the effect of harmonic choice upon the quality of the fit and of the resulting SMASH image reconstruction in a phantom. Measured component coil sensitivities along the centerline of the FOV in the left-right phase-encoding direction are shown in FIG. 7a. The six-element array used in this experiment was oriented perpendicular to the main field, and the resulting phase variation in sensitivities is evident in the presence of both real (solid lines) and imaginary (dashed lines) components. This phase variation results in an improved fit for harmonic order m=−1 as compared with m=1 (FIG. 7b). As a consequence, the image reconstructed using the negative harmonic shows less artifact and higher SNR than the comparable image obtained using the positive harmonic (FIG. 7d). Thus, the choice of target harmonic orders constitutes a useful degree of freedom.

The optimal choice tends to be predictable based on knowledge of the coil array used for imaging. In practice, for a particular coil configuration, the particular harmonic choice that will yield the best reconstruction is generally ascertainable in advance. This knowledge dictates the parameters of the fit, and the resulting disposition of synthesized composite k-space lines in the reconstruction. Optionally, the MRI software 24 may be configured to select automatically a set of harmonics, taking into account various factors, such as the orientation of the array with respect to the magnetic fields, the particular coil array being used and the image plane of interest. Particular harmonics may be selected based on goodness of fit of the coil sensitivities to the harmonic or any other manner.

Tailored Harmonics

Figure 8A:
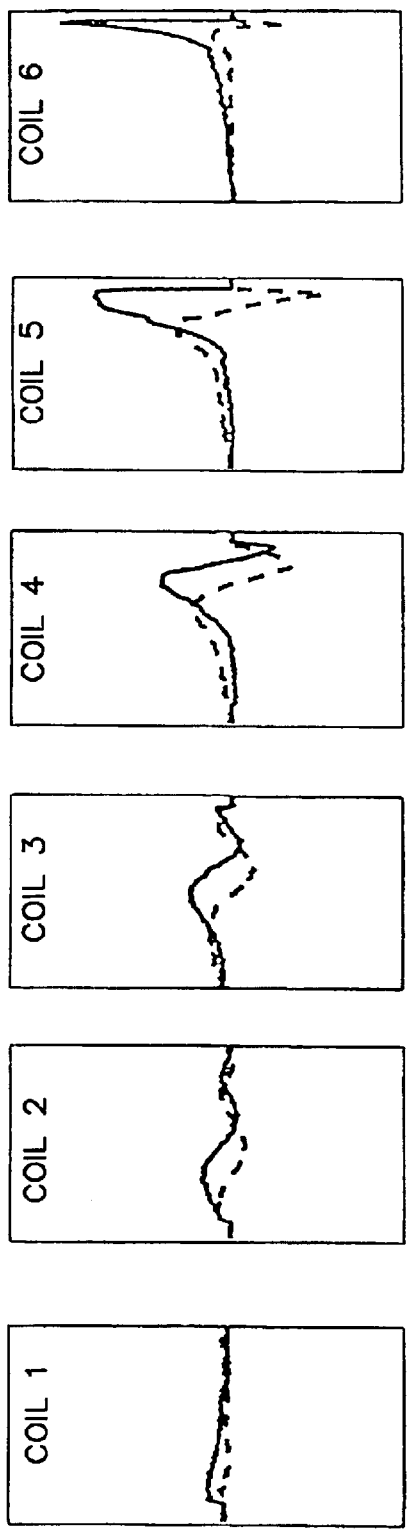
FIGS. 8a–8d illustrate the effect of angulation of the image plane in the phase encode direction and how this results in asymmetries in the coil sensitivities, and demonstrates the use of tailored harmonics.
Figure 8B:
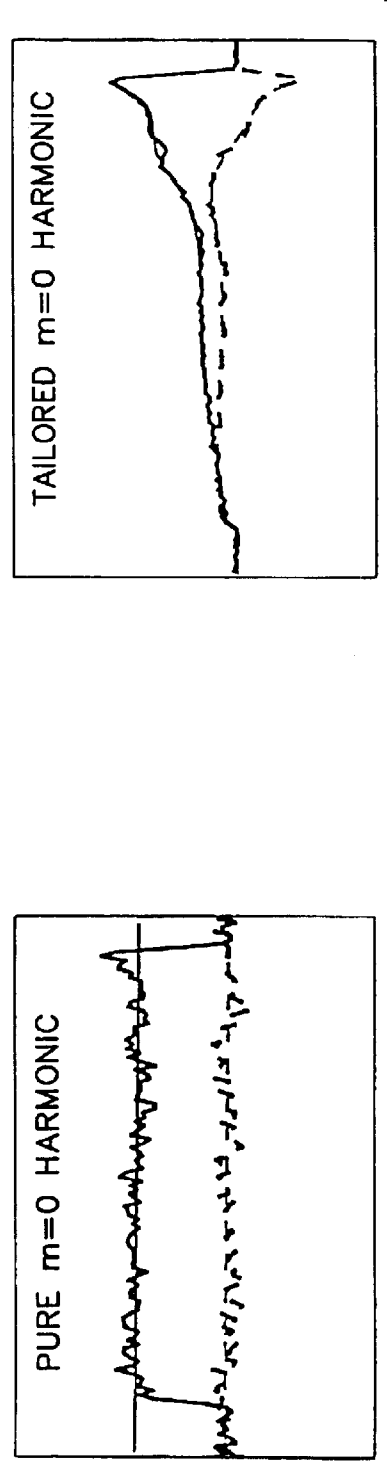
Figure 8C:
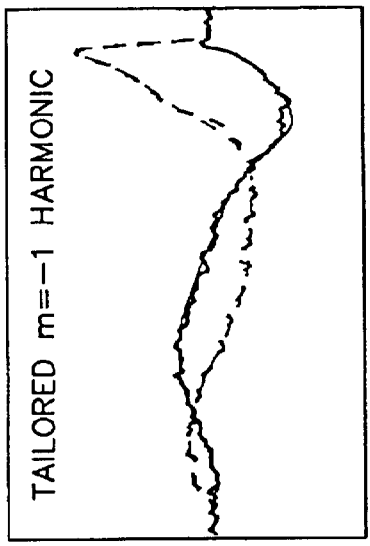
Figure 8C:
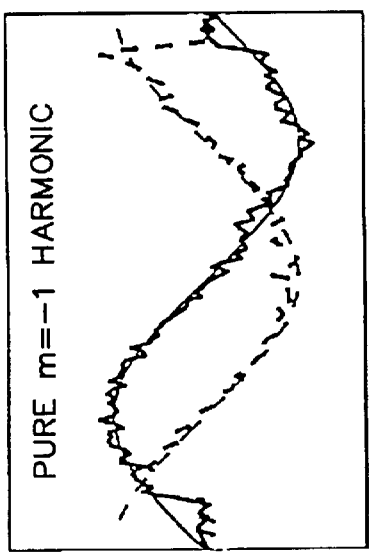

When the image plane is angulated in the phase encode direction, the distance between the coils and a respective portion of the image plane differs from one side of the array to the other. In this case, applicant has found, the coil sensitivity to signals emitted from the nuclei in the image plane also varies. For example, as shown in FIG. 8a, the sensitivity of coil 1 to NMR originating in the image plane may be much less than the sensitivity of coil 6. Accordingly, attempting to fit the coil sensitivities to a pure spatial harmonic results in large weightings to several coil sensitivities, allows enhanced susceptibility to noise, and may result in a relative poor fit.

To overcome these deficiencies, applicant has found that it is possible to tailor the harmonics to avoid several of these problems. Specifically, applicant discovered that the pure target harmonics shown in FIGS. 7a–7b represent a choice of $C_0=1$ in Eq. (1). Although this simplest choice most closely emulates the physical effects of field gradients, applicant has found that this is by no means the only allowed choice of $C_0$. In fact, applicant has found that any arbitrarily varying function $C_0(x,y)$ may be chosen: as long as the same function is used to multiply all harmonics in Eq. (1). Thus, the harmonics may be tailored by multiplying the harmonics by a given function. The result (see Eq. (2)) is simply a reconstructed image whose intrinsic intensity has been multiplied by $C_0$, i.e. $\rho(x,y) \to C_0(x,y)\rho(x,y)$. This freedom may be used to adjust for sensitivity variations along the phase encode direction which might otherwise be difficult to accommodate in a pure spatial harmonic fit.

For example, as shown in FIGS. 8a–8d, angulation of the image plane in the phase encode direction results in asymmetries in the coil sensitivities. The choice:

$$C_0(x, y) = \sum_{l=1}^{L} C_l(x, y) \quad (11)$$

adjusts the target harmonics to match these asymmetries, and results in an improved fit. This 'simple sum' tailored harmonic choice also improves fitting at the edges of extended FOVs where the coil sensitivities fall off and generation of flat intensity profiles can be difficult.

In practice, a phased sum is generally used in place of the simple sum in Eq. (11), i.e.

$$C_0(x, y) = \sum_{l=1}^{L} C_l(x, y) \exp i\phi_l \quad (12)$$

where the phases $\Phi_l$ are chosen to adjust for any differences in phasing between the component coils (e.g. from differing cable lengths) which might otherwise result in destructive interference in the sum. This phasing procedure may be automated by fitting each coil sensitivity individually to its absolute magnitude to derive the appropriate phase.

Figure 8D:
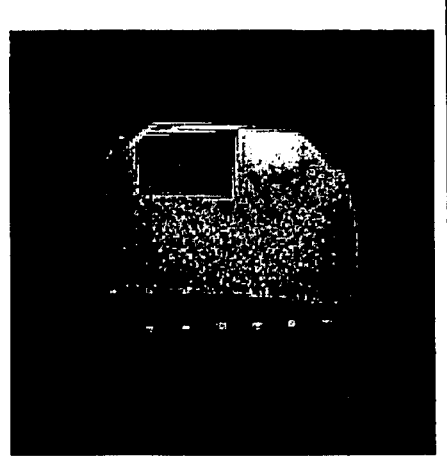
Figure 8D:
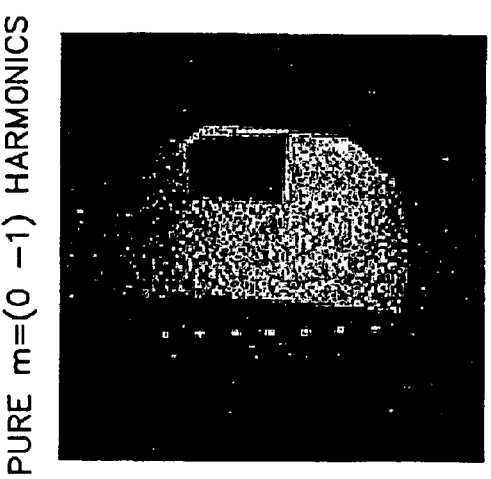

FIG. 8d shows phantom image reconstructions in a single-oblique plane using pure harmonics and tailored phased sum harmonics, respectively. The apparent SNR improvement in the tailored harmonic reconstruction has two principal sources. One is the falloff of intensity in the tailored harmonics themselves, which tends to attenuate reconstructed image intensity in regions of low sensitivity and high noise. This overall intensity modulation does not affect actual image SNR, since the attenuation is shared by signal and noise terms alike. The use of tailored harmonics may also result in smaller weights $n_l^{(m)}$, however, which have been shown to produce genuine SNR improvements by reducing the amount of noise multiplication for any given reconstructed signal intensity.

Multi-Line Fits

Coil sensitivities may also be affected when the image plane is angulated in the frequency encode direction. Specifically, when the image plane is angled in this frequency encode direction, one part of the image plane is closer to a coil than another part of the image plane is to that same coil. Applicant has found, that using a single coil sensitivity for all positions in the frequency encode direction can introduce inaccuracies into the reconstruction.

Specifically, all of the image reconstructions shown so far have used sensitivity profiles along a single diameter of the FOV for spatial harmonic fitting. In other words, $$\sum_{l=1}^{L} n_l^{(m)} C_l(x_0, y) \approx C_o(x_0, y) \exp(im\Delta k_y y) \quad (13)$$

where y is the phase encode direction and $x_0$ is a single position along the frequency encode direction. The weights derived from these single-line fits were assumed to apply equally well for all positions x along the frequency encode direction. This assumption is generally valid whenever the coil sensitivity functions are approximately separable, in the sense that $C_l(x,y) \approx C_{lx}(x)C_{ly}(y)$. Image planes parallel to the coil array, with dimensions not substantially exceeding the array dimensions, tend to have this property, with offset from any given line $x_0$ resulting in changes in the amplitude $C_{lx}(x)$ but not the shape $C_{ly}(y)$ of the sensitivity functions along the phase encode direction. When angulations of the image plane along the frequency encode direction are introduced, however, the shape of the sensitivities along y may change significantly as a function of x position. In this case, fitting coefficients from one x position may not yield accurate spatial harmonics at another x position. This situation is illustrated in FIG. 9a.

Applicant has found that it is possible to perform different fits for different positions along the frequency-encoding direction. For this purpose, the coil sensitivities may be segmented into strips, each represented by an individual coil sensitivity profile. The number of strips may be varied as needed, up to one fit for each frequency-encoding position, or a line-by-line fit. Weighting coefficients are then applied separately to each corresponding region in the signal.

In practice, this may be accomplished by first performing a Fourier transform along the frequency encode direction, then segmenting the resulting transformed signals into the same strips as the coil sensitivity references, and applying separate weighting coefficients to each strip. FIG. 9b shows the results of a multi-line fit, yielding improved harmonics and reduced residual aliasing at positions displaced from the center line of the image.

Figure 9A:
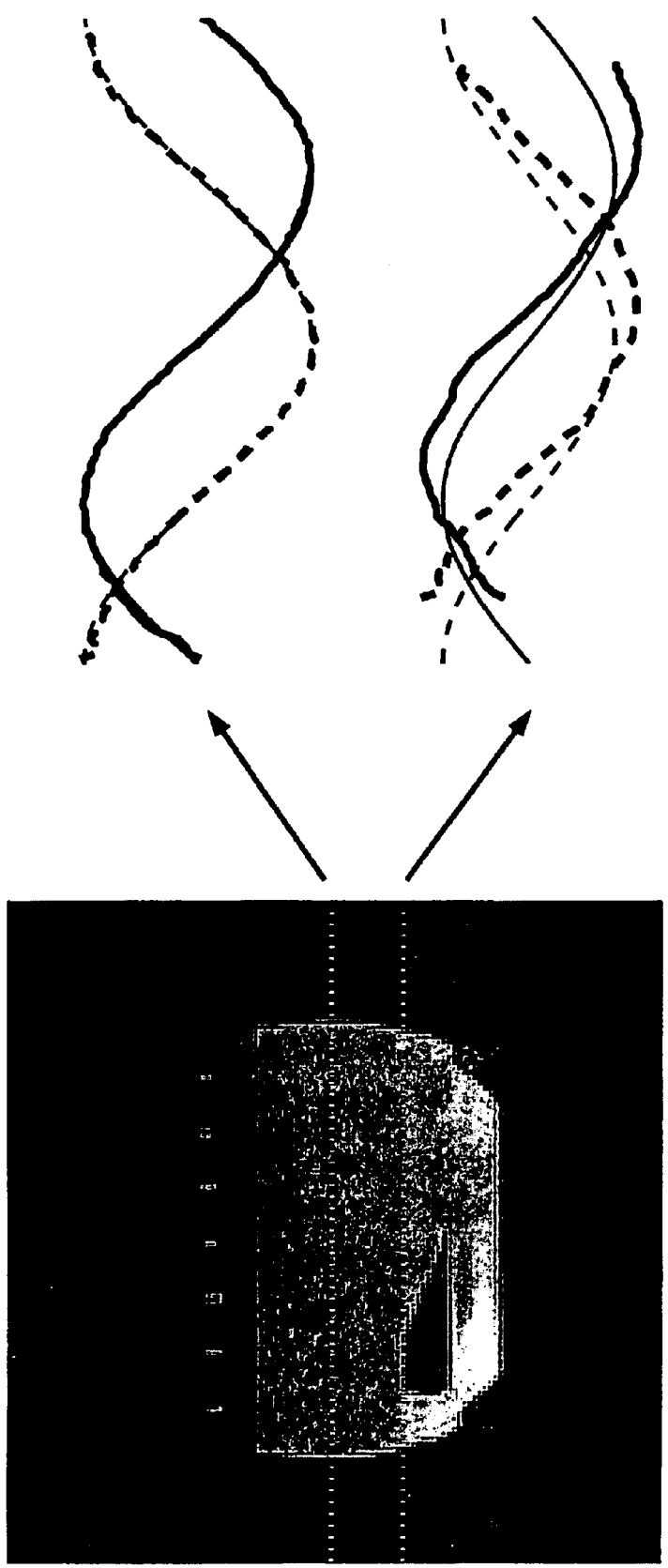
FIGS. 9a–9b illustrate the effect of using multi-line fitting of coefficients along the frequency encode direction.
Figure 9B:
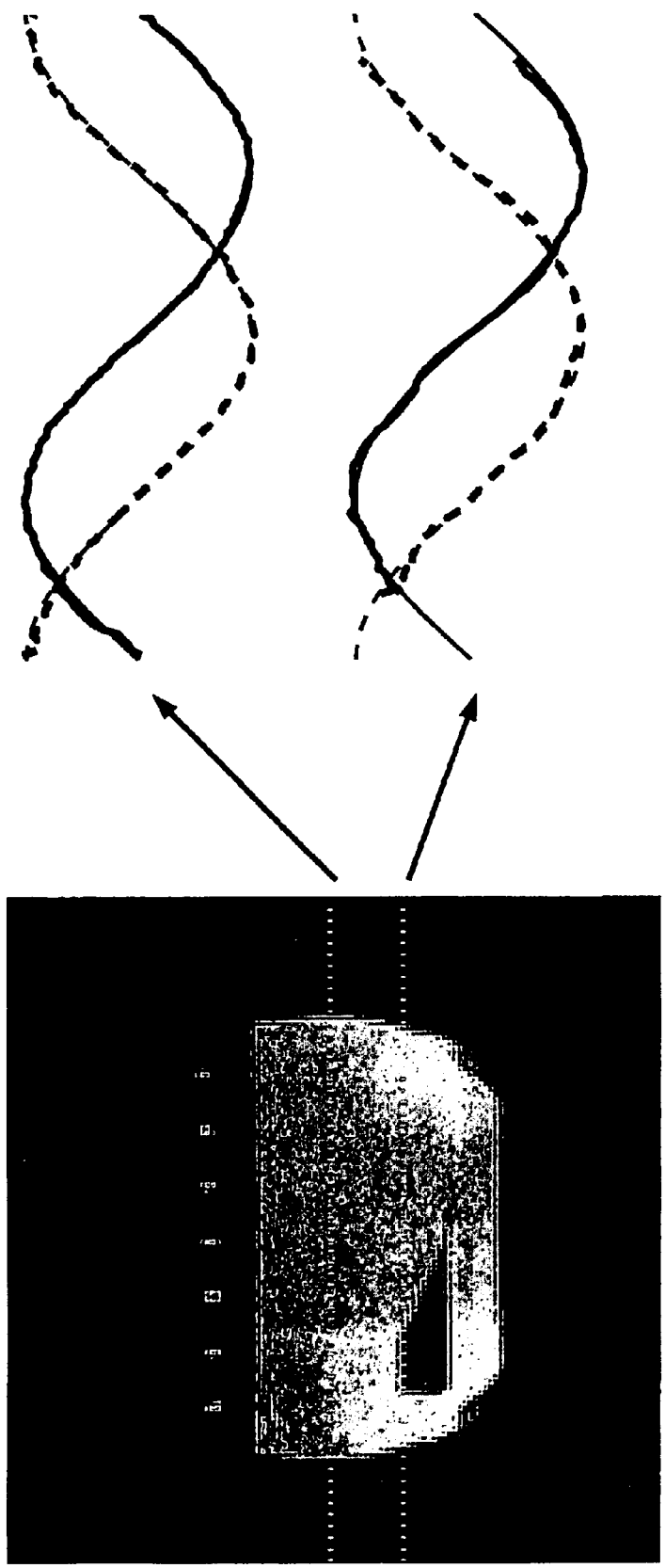

FIGS. 9a and 9b contrast SMASH image reconstructions using single-line (a) versus multi-line (b) spatial harmonic fits, for an oblique image plane tilted along the frequency encode direction. Actual spatial harmonic fits (thick lines) and target harmonics (thin lines) along the two dotted lines in the images are shown to the right. In FIGS. 9a and 9b, a SMASH acceleration factor of two was used, as was the same sequence and hardware as in the previous figures, with 22.5° angulation of the image plane in the frequency encode direction.

Thus, just as the use of tailored harmonics adjusts for variations in sensitivity along the phase encode direction, multi-line fits may be used to adjust for sensitivity variations along the frequency encode direction. The introduction of additional fits can lengthen image reconstruction times slightly, though generally this penalty is not severe, especially when the fits are performed using rapid matrix inversion techniques (see 'Conditioned Fits' below), in which case the total reconstruction time may be increased by only a fraction of its original value (on the order of several seconds). Of course, any additional fitting does sacrifice some of the efficiency of the 'pure' SMASH k-space reconstruction, in which only a small number of linear combinations are used in combination with a single Fourier transform. Though the single-line approach is particularly appropriate for rapid in-line implementation in hardware, and can generally accommodate a range of slice angulations, a multi-line approach may be used to reduce artifacts in highly oblique or double-oblique planes.

Figure 10C:
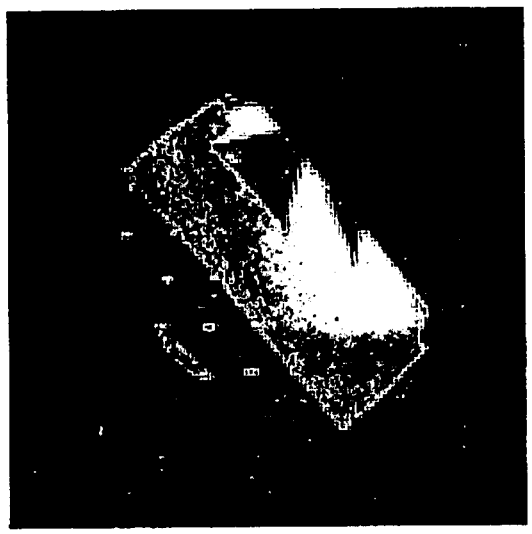
FIGS. 10a–10c illustrate the benefit of multi-line fitting in a double oblique SMASH image reconstruction on a phantom.
Figure 10B:
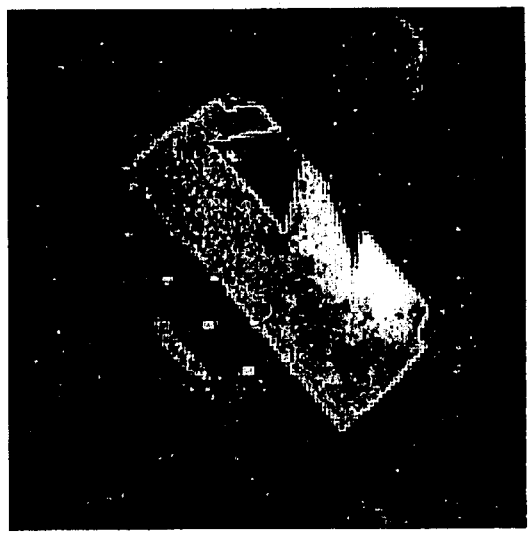
Figure 10A:
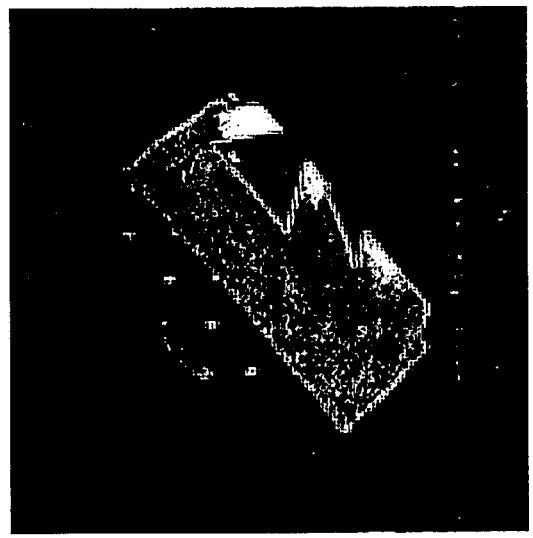

FIGS. 10a–10c show the benefits of multi-line fitting in a double-oblique SMASH image reconstruction on a phantom. FIG. 10a is a traditionally acquired reference image, reconstructed using a sum-of-squares combination of component coil images. While the image reconstructed with a single-line fit (FIG. 10b) shows residual aliasing on either side of the selected center line, line-by-line fitting yields an image comparable to the traditionally acquired reference image in the same plane (FIG. 10c).

In Vivo Sensitivities

The degrees of freedom exploited in the tailored harmonic fitting and the multi-line fitting approaches just described together amount to a pixel-by-pixel freedom in the choice of the target function $C_0(x,y)$. A similar freedom also applies to the sensitivity functions $C_l(x,y)$ themselves. Indeed, both sides of Eq. (1) may be multiplied by an arbitrarily varying function $\sigma(x,y)$ to yield $$\sum_{l=1}^{L} n_l^{(m)} \sigma(x,y) C_l(x,y) \approx \sigma(x,y) C_0(x,y) \exp(im\Delta k_y y) \quad (14)$$

Though Eq. (14) may not seem significantly distinct from Eq. (1), it has an important practical consequence. If $\sigma(x,y)$ is taken to be a spin density function, then $\sigma(x,y)C_l(x,y) \equiv I_l(x,y)$ represents the intensity of a component coil image in the plane of interest. In other words, Eq. (14) allows the use of in vivo sensitivity reference images in place of "pure" sensitivity references for spatial harmonic fitting. Accordingly, as shown in FIG. 11b, it is then possible to use the intensity of the component coil images instead of the pure sensitivities of the component coils, illustrated in FIGS. 7a and 8a, when performing a reconstruction.

Specifically, if a set of component coil reference images $I_l(x,y)$ (FIG. 11a) of a patient are acquired in the target image plane, then a fit satisfying $$\sum_{l=1}^{L} n_l^{(m)} I_l(x,y) \approx I_0(x,y) \exp(im\Delta k_y y) \quad (15)$$

yields valid fitting coefficients for a SMASH image reconstruction. A phased sum $$I_0(x,y) = \sum_{l=1}^{L} I_l(x,y) \exp i\phi_l$$

may be used to generate the target functions, without any reference to the "pure" sensitivities.

Thus, there is no need to avoid or adjust for non-sensitivity-related intensity variations in the image. Since these variations multiply both the source and the target functions identically, they are automatically accounted for in the fit. The only requirement is that some intensity remains over enough of the target FOV to produce an accurate fit—a requirement shared with an AUTO-SMASH calibration technique described in U.S. patent application Ser. No. 09/050,404, filed Mar. 30, 1999, the content of which is hereby incorporated by reference. Stated in another way, it is only the differences between (or, strictly speaking, the ratios of) component coil images which matter for sensitivity calibration. Any feature shared by all component coils naturally factors out of the reconstruction.

Applicant has further found that the "spin density" $\sigma(x,y)$ need not be identical to the full spin density $\rho(x,y)$ in the SMASH-reconstructed image, and that low-resolution in vivo sensitivity references may be used, with potentially different slice thickness, relaxation properties, and temporal resolution from the target image. Since coil sensitivities tend to vary slowly as compared with spin density variations, very low spatial resolutions may be used (often as low as allowed by scanner software), and acquisition of the sensitivity references can be quite rapid. Though it is frequently convenient to perform the sensitivity reference scans in the same image planes to be used for the full acquisitions, sensitivities may even be interpolated from in vivo reference stacks in other orientations, so long as the fit is performed over the appropriate FOV. The in vivo sensitivity calibration approach is then particularly useful for areas such as the thorax, in which "pure" sensitivities are difficult to derive, or in regions of low intrinsic signal, such as the lungs.

EXAMPLES

Figure 11A:
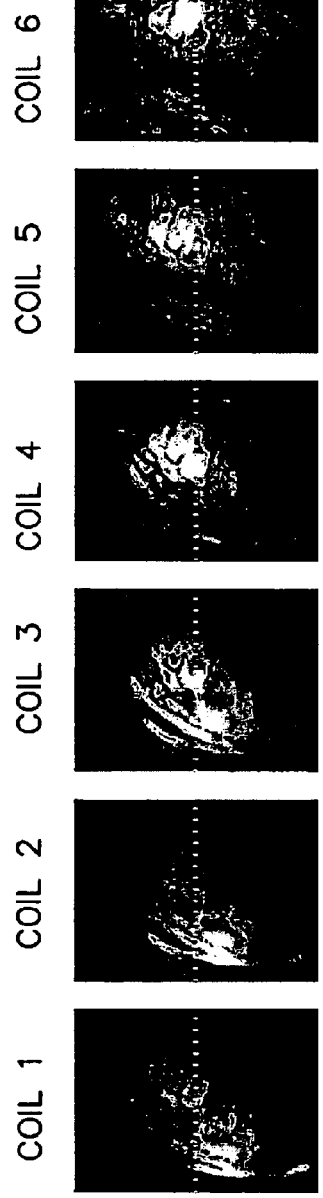
FIGS. 11a–11c illustrate an example of a high resolution cardiac SMASH image reconstructed using a rapid low-resolution in vivo sensitivity reference using an in vivo sensitivity calibration approach.
Figure 11B:
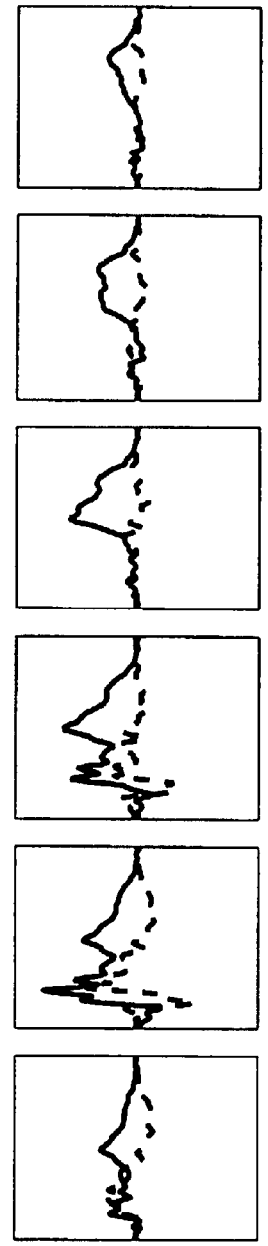
Figure 11C:
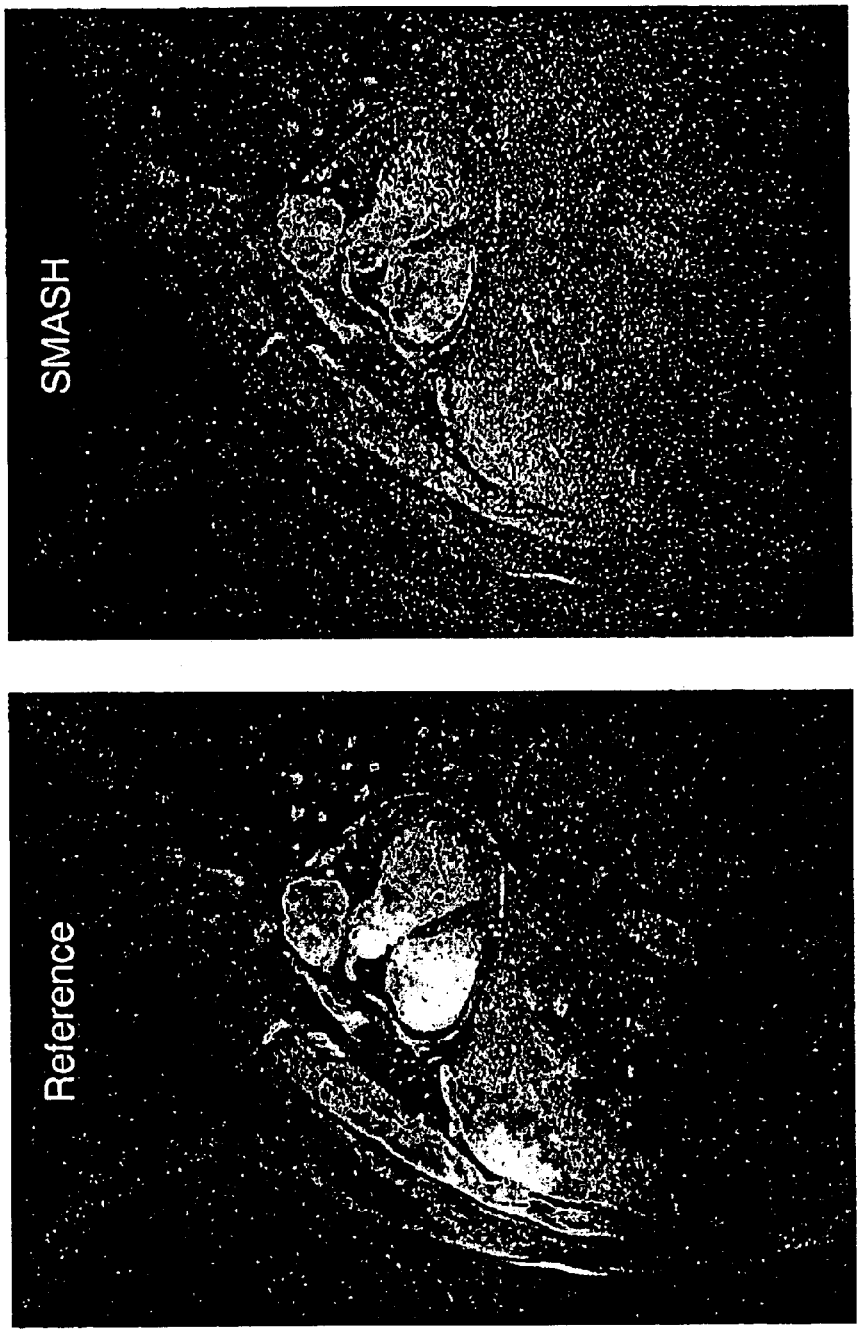

FIGS. 11a–11c show an example of a high-resolution cardiac SMASH image reconstructed using a rapid low-resolution in vivo sensitivity reference. The double-oblique plane of this image (FIG. 11c) contains an extended segment of the right coronary artery, whose course is equally apparent in the two-fold accelerated SMASH image as in the reference fully gradient-encoded image. Specifically, FIG. 11a contains low-resolution in vivo sensitivity maps of coils 1–6 in a double-oblique plane. FIG. 11b illustrates real (solid) and imaginary (dashed) components of coil intensity profiles along the dotted lines in FIG. 11a. FIG. 11c, shows a comparison between a SMASH reconstruction using the coil intensity profiles and a reference image. In this image, the image plane was angled 38° in a foot-head direction and 16° in a right-left direction. The SMASH reconstruction extends smoothly over low-signal regions of lung, without requiring any thresholding or interpolation. Tailored phased sum harmonics and multi-line fitting were also used in connection with this reconstruction. Thus, FIG. 11c represents a convergence of the various tailored fitting procedures described so far. The reference image was reconstructed using a sum of squares combination of component coil images.

Conditioned Fits

Tailored fits are designed to reduce residual artifacts in the reconstructions due to departures from perfect spatial harmonics. Errors in harmonics are not the only source of potential image quality degradation in SMASH reconstructions, however. The influence of the reconstruction upon the distribution of noise and SNR must also be taken into account. Noise propagation effects can be divided into two categories: the effects of noise in the measured signals to be reconstructed, and the effects of noise in the sensitivity references.

The behavior of noise in the measured signals is dependent on the properties of the weights $n_l^{(m)}$. The magnitudes of these weights indicate to what extent noise from the measured MR signals must be multiplied in order to construct the desired composite signals. Correlation of the weights, as represented by the orthogonality of weight vectors, governs the spatial distribution of noise in the reconstructed image. As discussed above in connection with tailored fits, the SNR can be improved in some cases by preventing the generation of large weights resulting from fitting to inappropriate target functions.

Unexpectedly, noise in the measured coil sensitivities does not propagate in a similar fashion through the SMASH reconstruction, even though noise in the measured sensitivities represents a departure from the "true" sensitivities inherent in the MR signals. Although increased noise in the sensitivity maps would be expected to result in noisier reconstructions, in fact, the opposite is true. Applicant has discovered that noise in the sensitivity maps actually improves the SNR of a SMASH reconstruction.

Figure 12A:
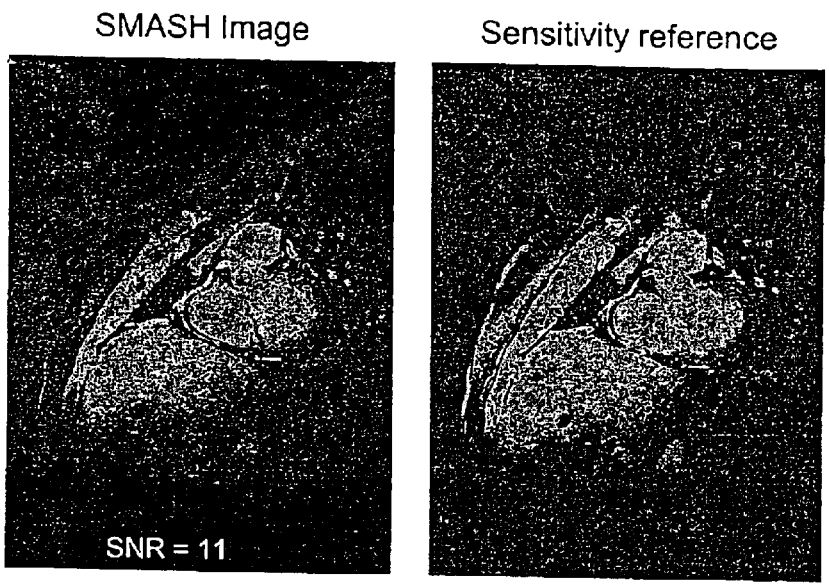
FIGS. 12a–12c illustrate the effect of noise in the measured coil sensitivities and its effect on SMASH reconstructions, and also illustrates the effect/use of numerical conditioning.
Figure 12B:
Figure 12C:
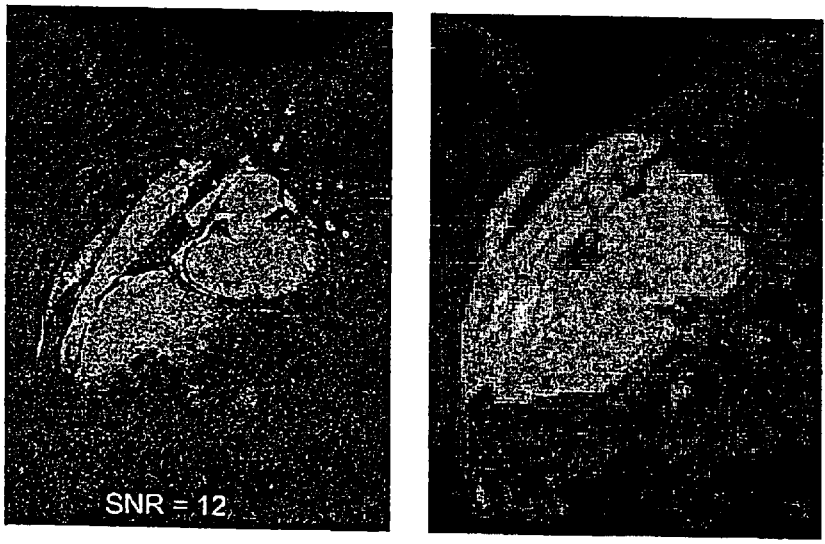
Figure 13A:
FIGS. 13a–13f show a series of progressively improved double-oblique cardiac image reconstructions using progressive combinations of various tailoring and conditioning techniques.
Figure 13B:
Figure 13C:
Figure 13D:
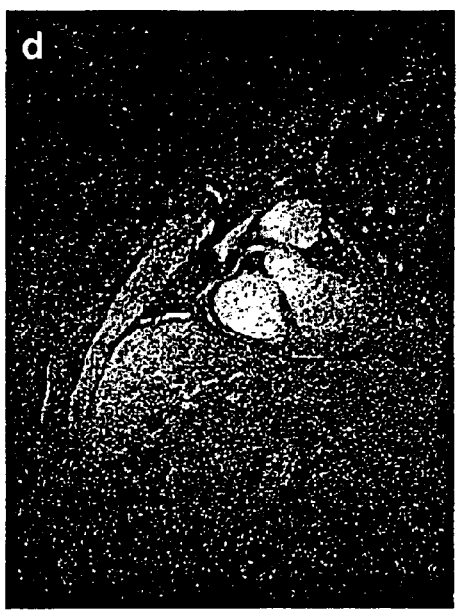
Figure 13E:
Figure 13F:

An example of this phenomenon is shown in FIGS. 12a–12c. FIG. 12b shows a SMASH reconstruction of the double-oblique cardiac image from the previous section, obtained using a low-resolution, high-SNR in vivo sensitivity map. FIG. 12a shows a reconstruction of the same data using a high-resolution sensitivity map with significantly lower SNR. Use of the high-resolution, low-SNR sensitivity map in FIG. 12a results in a SMASH image with a higher SNR. Simulations at constant sensitivity reference resolution have also confirmed that noise added to the sensitivity maps independently improves SNR in the reconstructions. This effect is precisely the opposite of what is expected for pixel-by-pixel image domain parallel reconstructions, where noise in the sensitivities propagates directly into the reconstructed image.

To explain this unexpected phenomenon, the measured coil sensitivities can be modeled as a 'true' sensitivity C plus a noise contribution N:

$$C_l^{measured}(x, y) = C_l(x, y) + N_l(x, y) \qquad (16)$$

or, using a discrete pixel index j in place of the pixel position (x,y), $$C_{jl}^{measured} = C_{jl} + N_{jl} \qquad (17)$$

Now, solving for weights $n_l^{(m)} \equiv n_{lm}$ such that $$\sum_{l=1}^{L} C_{jl}^{measured} n_{lm} \approx C_{0j} \exp(im\Delta k j) \equiv T_{jm} \qquad (18)$$

where $T_{jm}$ are the target tailored harmonics. Equation (18) may be rewritten as a matrix equation $$C^{measured} \cdot n = T \qquad (19)$$

which may be inverted to yield an expression for the weights n:

$$n = T \cdot (C^{measured})^{-1} \qquad (20)$$

The matrix $C^{measured}$ is rectangular with the number of rows generally much greater than the number of columns (i.e. the number of pixels along the phase-encode direction in the sensitivity map is generally greater than the number of array elements L). Therefore, the inverse $(C^{measured})^{-1}$ may conveniently be accomplished using a pseudoinverse formula representing the matrix least squares solution to the overdetermined problem of Eq. (19):

$$(C^{measured})^{-1} \rightarrow ((C^{measured})^{\dagger} C^{measured})^{-1} (C^{measured})^{\dagger} \qquad (21)$$

Here, $(C^{measured})^{\dagger}$ is the Hermitian transpose, or conjugate transpose, of $C^{measured}$. This rapid and straightforward matrix pseudoinverse approach may conveniently be substituted for iterative spatial harmonic fitting algorithms.

Expanding $C^{measured}$ in Eq. (21) yields the following expression for the pseudoinverse:

$$(C^{(measured)})^{-1} \rightarrow ((C^{\dagger} + N^{\dagger})(C + N))^{-1} (C^{\dagger} + N^{\dagger}) \qquad (22)$$

$$= (C^{\dagger}C + C^{\dagger}N + N^{\dagger}C + N^{\dagger}N)^{-1} (C^{\dagger} + N^{\dagger})$$

The effect of the extra noise terms upon the pseudoinverse, and hence upon the calculated SMASH weights, may be estimated by making some simple assumptions about the character of the noise. In particular, assuming that the noise is Gaussian-distributed with an equal probability of positive or negative contributions in each pixel, and shares none of the spatial structure of the coil sensitivities, then the $C^{\dagger}N$ and $N^{\dagger}C$ terms in Eq. (22) may be neglected, especially for sufficiently large pixel numbers and noise standard deviations. In other words, the noise contributions may be treated as orthogonal interferents to the sensitivities. Equation (22) then becomes $$(C^{measured})^{-1} \approx (C^{\dagger}C + N^{\dagger}N)^{-1} (C^{\dagger} + N^{\dagger}) \qquad (23)$$

If the noise may also be treated as effectively orthogonal to the target harmonics (an assumption which is reasonable under essentially the same conditions as have already been outlined for the sensitivities), then the final $N^\dagger$ term may be neglected in favor of $C^\dagger$ in the sum, and Eq. (20) simplifies to $$n \approx T(C^\dagger C + N^\dagger N)^{-1} C^\dagger \quad (24)$$

This expression differs from the "ideal" fit, given by the target functions multiplied by the pseudoinverse of the sensitivities, solely by the addition of the $N^\dagger N$ term. Now, both $N^\dagger N$ and $C^\dagger C$ are positive definite matrices, whose eigenvalues are also positive definite. Their sum is thus positive definite as well, with eigenvalues greater or equal in magnitude to the eigenvalues of either alone. It follows that the inverse $(C^\dagger C + N^\dagger N)^{-1}$ has smaller eigenvalues than the "ideal" inverse $(C^\dagger C)^{-1}$ alone. As a consequence, the calculated weights in the presence of sensitivity noise generally is smaller than in its absence, and smaller weights lead to improved SNR in a SMASH reconstruction.

Another way of characterizing this result is that the presence of orthogonal interferents, in the form of sensitivity noise, conditions the spatial harmonic fitting procedure to increase SNR at the expense of some accuracy in the calculated fit. The least-squares penalty associated with large weights is increased in the presence of rapidly fluctuating noise, and this penalty is balanced against the least-squares penalty of more slowly varying systematic deviations from the "ideal" fit. Such an observation offers a useful hint about fit conditioning. Regardless of the amount of sensitivity noise present, artificial orthogonal interferents can be added deliberately into the reconstruction, in order to prevent generation of unduly large weights resulting from small eigenvalues in the sensitivity matrix to be inverted. A simple procedure for fit conditioning may be implemented as follows: a multiple of cI of the identity matrix I is inserted into Eq. (24) in place of $N^\dagger N$, with the multiple c specified as a fraction $f$ of the maximum eigenvalue of $C^\dagger C$:

$$n \approx T(C^\dagger C + cI)^{-1} C^\dagger \quad (25)$$

$$c = f \cdot \max(eig(C^\dagger C))$$

This corresponds to an idealized physical situation in which the noise in the various component coils is entirely uncorrelated, and has a common norm. In any case, the single conditioning factor $f$ allows a smoothly scalable tradeoff between reconstruction artifact and SNR.

FIG. 12c provides an in vivo example of a deliberately conditioned fit using the procedure of Eq. (25). Use of the same low-resolution in vivo sensitivity map as was used for FIG. 12b, but with a conditioning factor $f=0.05$, results in an image comparable in SNR to the image obtained with the high-resolution map (FIG. 12a). Thus, it is possible to preserve the advantages of the high-resolution map without its corresponding extended acquisition time, which might otherwise counterbalance some of the benefits of accelerated parallel data acquisition. Though the use of a nonzero conditioning factor is in principle associated with some degradation in the accuracy of the spatial harmonic fits, no significant aliasing artifact is observed above the noise background at the level of conditioning used in FIG. 12c.

Thus, using straightforward conditioning procedures, the SNR in SMASH reconstructions may be traded off smoothly against accuracy of spatial harmonic fitting. Some degree of conditioning is already inherent in the SMASH reconstruction through the spatial harmonic fitting procedure itself, which naturally 'fits over' localized noise or sensitivity calibration errors. This natural conditioning may be enhanced with judicious addition of orthogonal interferents.

Alternative modes of numerical conditioning, related to but distinct from the orthogonal interferent method just described, are also possible. All of these approaches are based on the fact that the smallest eigenvalues in the matrix to be inverted represent potential numerical instabilities in the reconstruction. Since small eigenvalues will be inverted to large values in the inversion process, either noise or systematic errors in sensitivity calibration affecting the eigenvectors associated with these small eigenvalues will be amplified in the reconstruction. The orthogonal interferent approach corresponds to establishing a minimum eigenvalue threshold, such as a fraction of the maximum eigenvalue, and adding that threshold value to all eigenvalues of $C^\dagger C$ prior to inversion.

Alternatively, one may eliminate all eigenvalues below the eigenvalue threshold from the inversion, or else set all sub-threshold eigenvalues equal to the threshold value. Procedurally, this may be accomplished by performing a diagonalization of $C^\dagger C$ $$C^\dagger C = U^\dagger D U \quad (26)$$

(where U is a unitary matrix and D is a diagonal matrix containing the eigenvalues of $C^\dagger C$), manipulating the eigenvalues along the diagonal of D to yield a new diagonal matrix D', and inverting D' to give the conditioned inverse of $C^\dagger C$:

$$(C^\dagger C)_{conditioned}^{-1} = U^\dagger (D')^{-1} U \quad (27)$$

This results in conditioned SMASH weight factors of the form $$n \approx T(C^\dagger C)_{conditioned}^{-1} C^\dagger \quad (28)$$

Similar conditioning may also be applied directly to the non-square sensitivity profile matrix C using another generalized inverse procedure involving the singular value decomposition (SVD). SVD of the C matrix yields $$C = U^\dagger D V \quad (29)$$

where U and V are unitary matrices and D is a diagonal matrix containing non-zero eigenvalues of C in order of decreasing size. D may once again be modified to D' using one of the eigenvalue threshold procedures described above, and the conditioned inverse may then be performed as $$C_{conditioned}^{-1} = V^\dagger (D')^{-1} U \quad (30)$$

The resulting conditioned SMASH weight factors take the form $$n \approx T C_{conditioned}^{-1} \quad (31)$$

Conditioning may be particularly important at high acceleration factors, where noise and sensitivity calibration errors propagate particularly powerfully through parallel image reconstructions, whether based in k-space or in the image domain. Due to the spatial harmonic fitting constraints in SMASH, or to the potential singularity of pixel-by-pixel matrix inversions in SENSE or subencoding, noise multiplication factors can be high in the absence of conditioning at high accelerations. The result of the conditioning process is to modify or eliminate from the inversion the components of the inverted matrix most responsible for noise and error propagation, resulting in improved signal to noise ratio in the reconstructed images.

EXAMPLES

FIGS. 13a–13f show a series of progressively improved double-oblique cardiac image reconstructions, using progressive combinations of various tailoring and conditioning techniques. In these figures, FIG. 13a was found using a traditional SMASH approach without any of the tailoring described herein. Additional techniques were then applied to the same k-space data to form the additional images. Specifically, these images show the results of using an appropriate choice of harmonics (13b), tailored harmonics (13c) multi-line fits (13d), in vivo sensitivity references (13e), and well-conditioned pseudoinverse fits (13f). Thus, it is possible, using these described techniques, to obtain a high-quality in vivo SMASH image even for highly angulated image planes.

Image Domain Techniques

Just as SMASH reconstructions may be improved by modifying the spatial harmonic fitting procedure, so image-domain reconstructions may be rendered more flexible and robust by taking advantage of degrees of freedom in the pixel-by-pixel inversion procedure which forms the basis of techniques like subencoding and SENSE.

In Vivo Sensitivities

The image domain SENSE technique, described in the Background of the Invention section hereof, involves acquiring reference images $I^{ref}(x,y)$ in the component coils of the array, along with an additional body coil image or combination image representative of the spin density $\sigma(x,y)$, and applying several stages of interpolation, filtering, and thresholding to the quotient $I^{ref}(x,y)/\sigma(x,y)$. The aim of this procedure is to regenerate the pure sensitivities $C(x,y)$, which enter into the sensitivity matrix to be inverted in the image domain reconstruction. However, this process is time consuming to implement and is susceptible to errors, especially in body regions dominated by noise where the quotient may become poorly behaved.

Applicant has found that instead of pure sensitivities $C(x,y)$, it is possible to use an in vivo reference image $I^{ref}(x,y)=C(x,y)\sigma(x,y)$, in the inversion itself. Here, $\sigma(x,y)$ is a spin density function which need not be identical to $\rho(x,y)$ (e.g. different sequence parameters, contrast, resolution, etc.). Applicant has further found that correction for $\sigma(x,y)$ using the body coil reference is unnecessary if the subencoding inversion is appropriately configured. Expressing Eq. (8) in terms of the in vivo reference image values yields $$\begin{bmatrix} I_1^{fold} \\ I_2^{fold} \\ I_3^{fold} \\ I_4^{fold} \end{bmatrix} = \begin{bmatrix} C_{11} & C_{12} & C_{13} \\ C_{21} & C_{22} & C_{23} \\ C_{31} & C_{32} & C_{33} \\ C_{41} & C_{42} & C_{43} \end{bmatrix} \cdot \begin{bmatrix} \rho_1 \\ \rho_2 \\ \rho_3 \end{bmatrix} \quad (32)$$

$$= \begin{bmatrix} I_{11}^{ref}/\sigma_1 & I_{12}^{ref}/\sigma_2 & I_{13}^{ref}/\sigma_3 \\ I_{21}^{ref}/\sigma_1 & I_{22}^{ref}/\sigma_2 & I_{23}^{ref}/\sigma_3 \\ I_{31}^{ref}/\sigma_1 & I_{32}^{ref}/\sigma_2 & I_{33}^{ref}/\sigma_3 \\ I_{41}^{ref}/\sigma_1 & I_{42}^{ref}/\sigma_2 & I_{43}^{ref}/\sigma_3 \end{bmatrix} \cdot \begin{bmatrix} \rho_1 \\ \rho_2 \\ \rho_3 \end{bmatrix}$$

$$= \begin{bmatrix} I_{11}^{ref} & I_{12}^{ref} & I_{13}^{ref} \\ I_{21}^{ref} & I_{22}^{ref} & I_{23}^{ref} \\ I_{31}^{ref} & I_{32}^{ref} & I_{33}^{ref} \\ I_{41}^{ref} & I_{42}^{ref} & I_{43}^{ref} \end{bmatrix} \cdot \begin{bmatrix} 1/\sigma_1 & 0 & 0 \\ 0 & 1/\sigma_2 & 0 \\ 0 & 0 & 1/\sigma_3 \end{bmatrix} \cdot \begin{bmatrix} \rho_1 \\ \rho_2 \\ \rho_3 \end{bmatrix}$$

or, $$I^{fold}=I^{ref}\cdot\sigma^{-1}\cdot\rho \quad (33)$$

The unaliased spin density over the full FOV may then be determined as $$\rho=\sigma\cdot(I^{ref})^{-1}\cdot I^{fold} \quad (34)$$

The reference spin density $\sigma$ need not be known independently, since it is already contained in the in vivo reference images. Multiplication of both sides of Eq. (34) by a diagonal matrix containing the sensitivities from any component coil—for example component coil 1—yields an expression for the unaliased image in that component coil derived entirely from operations on the measured in vivo reference image $I^{ref}$:

$$\begin{bmatrix} C_{11}\rho_1 \\ C_{12}\rho_2 \\ C_{13}\rho_3 \end{bmatrix} = \begin{bmatrix} C_{11} & 0 & 0 \\ 0 & C_{12} & 0 \\ 0 & 0 & C_{13} \end{bmatrix}\begin{bmatrix} \rho_1 \\ \rho_2 \\ \rho_3 \end{bmatrix} \quad (35)$$

$$= \begin{bmatrix} C_{11} & 0 & 0 \\ 0 & C_{12} & 0 \\ 0 & 0 & C_{13} \end{bmatrix}\begin{bmatrix} \sigma_1 & 0 & 0 \\ 0 & \sigma_2 & 0 \\ 0 & 0 & \sigma_3 \end{bmatrix}\cdot(I^{ref})^{-1}\cdot I^{fold}$$

$$= \begin{bmatrix} I_{11}^{ref} & 0 & 0 \\ 0 & I_{12}^{ref} & 0 \\ 0 & 0 & I_{13}^{ref} \end{bmatrix}\cdot(I^{ref})^{-1}\cdot I^{fold}$$

Such reconstructed component coil images may be combined, for example as the sum of squares, to yield a composite reconstructed image comparable to traditional combinations of fully gradient encoded images in arrays.

Thus, inversions performed on in vivo reference images rather than pure sensitivities may be corrected using simple postmultiplication by the reference images themselves. Accordingly, it is not necessary to use a separate body coil reference, and the extra acquisition and processing time associated with such a reference may be saved. The inversion-postmultiplication approach accomplishes an effective division by the spin density while avoiding the problems inherent in calculating actual quotient images. Furthermore, the pixel-by-pixel freedom inherent in Eq. (35) suggests that the reference image may be multiplied by any arbitrary function, for the purposes of additional tailoring or conditioning, and the result may also be corrected by simple postmultiplication.

Numerical Conditioning

Numerical conditioning procedures similar to those described above with respect to SMASH may also be added to the pixel-by-pixel inversion in image domain techniques. The generalized inverse $C^{-1}$ of the pixel-by-pixel sensitivity encoding matrix in Eq. (10) (or, alternatively, the generalized inverse $(I^{ref})^{-1}$ of the in vivo reference image matrix in Eq. (35)) may be performed using a pseudoinverse or an SVD procedure, a minimum eigenvalue threshold may be chosen, and conditioning may be introduced by (1) eliminating all eigenvalues below the eigenvalue threshold from the inversion; (2) setting all sub-threshold eigenvalues equal to the threshold value; (3) adding the threshold value to all eigenvalues; or (4) other methods known to practitioners of linear algebra.

By applying one or more of these numerical conditioning techniques, applicant has found that it is possible to modify or eliminate from the inversion the components of the inverted matrix most responsible for noise amplification and error propagation. This technique automatically adapts to the content of the reference data and only excludes or approximates regions which are destined to yield large errors in the reconstruction. As a result, it may improve the SNR and reduce artifacts in regions of poorly characterized sensitivities. The combination of numerical conditioning with in vivo sensitivities is particularly powerful, since the conditioning can automatically correct for areas of low signal intensity such as the lungs.

EXAMPLES

Figure 14A:
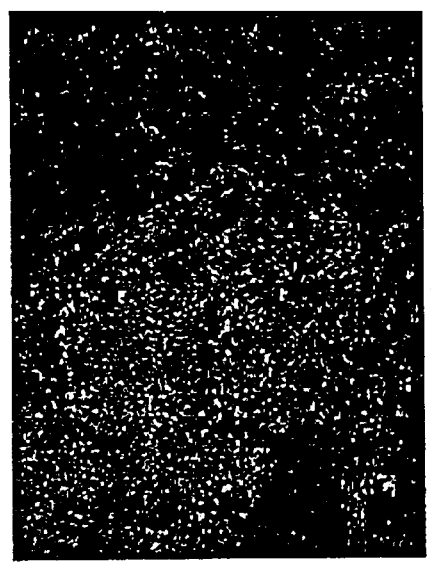
FIGS. 14a–14b compare image domain subencoding reconstructions of a five-fold accelerated cardiac MR image using an in vivo sensitivity reference with and without numerical conditioning.
Figure 14B:

FIGS. 14a–14b compare image domain subencoding reconstructions of a five-fold accelerated cardiac MR image using an in vivo sensitivity reference with and without numerical conditioning. In this study, a healthy adult volunteer was imaged using a six-element coil array. A low-resolution image set acquired using this array in the target image plane was used as the in vivo sensitivity reference set. For the conditioned reconstruction in FIG. 14b, an eigenvalue threshold was chosen at 50% of the maximum eigenvalue, and all sub-threshold eigenvalues were set equal to the threshold value during SVD inversion. The noise and artifact level in the conditioned reconstruction is clearly lower than the noise and artifact level in the unconditioned reconstruction. In this example, the conditioned reconstruction allows improved visualization of the right coronary artery and other cardiac structures.

Hybrid Parallel Imaging Techniques

Generalized Parallel MR Imaging

Applicant has discovered that both SMASH and subencoding/SENSE are special cases of a more generalized approach to parallel imaging. This generalized approach allows direct comparison of SMASH and subencoding/SENSE. Applicant has also discovered that modification of parameters in the generalized approach allows the generation of hybrid techniques combining some of the advantages of the k-space and the image domain approaches.

Furthermore, numerical conditioning such as that described above may be incorporated conveniently into the generalized formalism.

This generalized approach not only provides a unifying perspective connecting various parallel imaging techniques, but, in combination with appropriate numerical conditioning approaches, also allows substantive improvements to techniques such as SMASH and subencoding/SENSE, and enables hybrid approaches with further enhanced performance.

Applicant recognized that measured MR signal data is comprised of a generalized series of projections of the underlying distribution of MR-active spins in the imaged volume. A listing of the various projection functions then leads to practical strategies for parallel image reconstruction.

The MR signal detected in any given RF coil is the result of a spatial integration of spin density (ignoring relaxation) against the sensitivity $C_l$ of that coil and against the sinusoidal spatial modulations generated by encoding gradients:

$$S_l(k_x,k_y) = \int\int dx dy C_l(x,y)\exp(-ik_x x)\exp(-ik_y y)\rho(x,y) \quad (36)$$

Here, l=1,2,... L is the index of any component coil in an L-coil array, and $k_x$=0,1,..., $N_x$−1 and $k_y$=0,1,... $N_y$−1 are the k-space indices representing different frequency- or phase-encoding gradient steps. In other words, the signal comprises integrations or projections of the spin density against L*Nx*Ny distinct functions $$B_l(x,y,k_x,k_y)=C_l(x,y)\exp(-ik_x x)\exp(-ik_y y) \quad (37)$$

Figure 15:
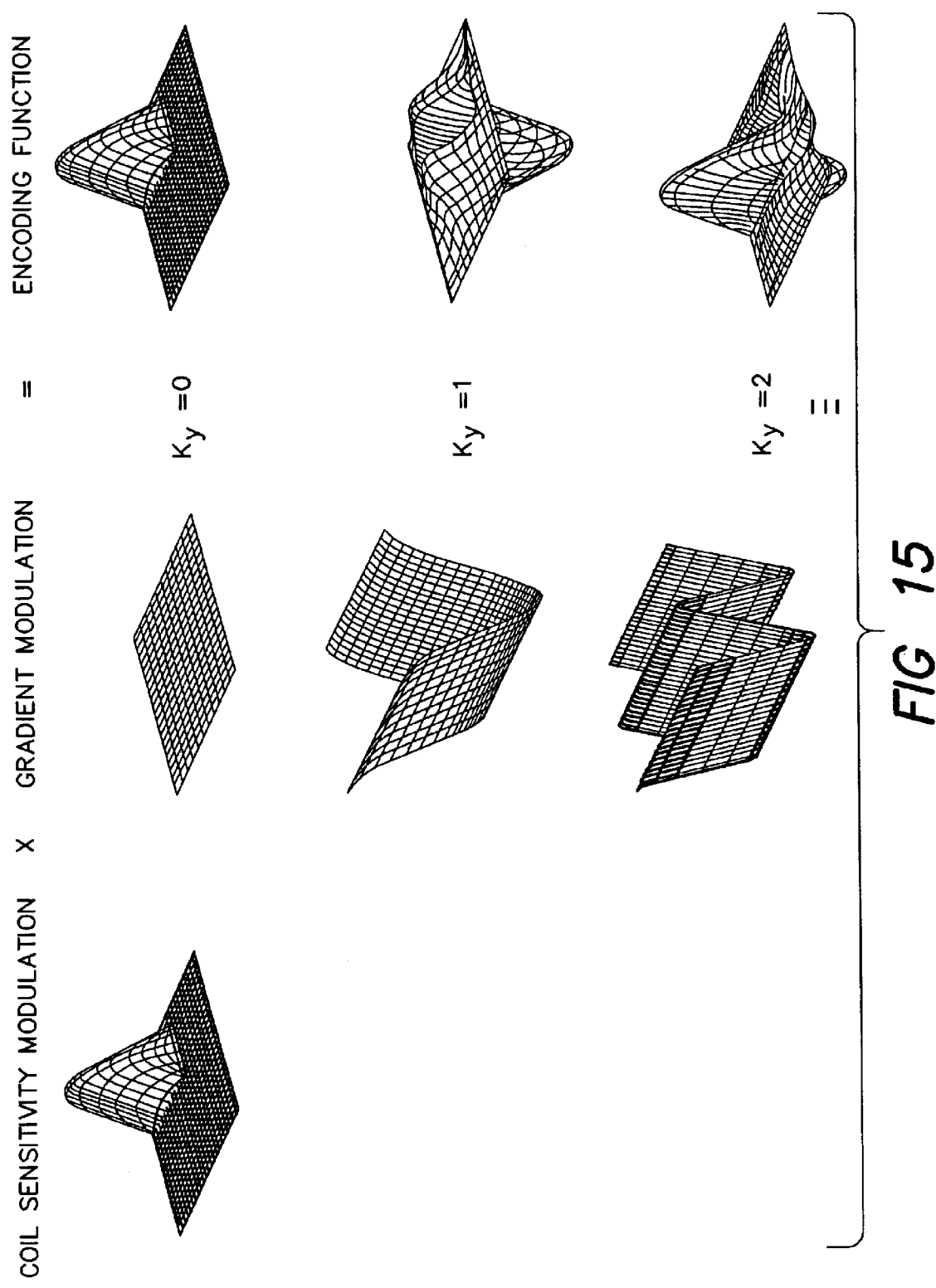
FIG. 15 shows illustrative encoding functions made up of coil sensitivity modulations and gradient modulations.

These functions will be referred to herein as "encoding functions," since they represent a method by which spatial encoding may be performed. FIG. 15 shows the composition of some sample encoding functions for a single surface coil and several phase encoding gradient steps. Specifically, as shown in FIG. 15, an encoding function is formed by imposing the coil sensitivity modulation on a gradient modulation. For example, in the first line of FIG. 15, the coil sensitivity modulation is multiplied by a flat gradient modulation. Thus, the first encoding function corresponds to the coil sensitivity modulation. In the second line, the coil sensitivity modulation is multiplied by the first harmonic to form a second encoding function. Numerous other encoding functions may likewise be formed. For simplicity, only the real parts of the various functions are shown in FIG. 15. In practice, the coil sensitivities and gradient modulations have both real and imaginary components, as do the encoding functions formed from their products.

By approximating the integral in Eq. (36) with a discrete sum, Eq. (36) may be written as follows, using a single k-space index k=($k_x,k_y$) and a corresponding single pixel index j=(x,y):

$$S_l(k_x,k_y) \equiv S_{kl} \approx \sum_j C_{jl}\exp(-2\pi i jk)\rho_j \equiv \sum_j B_{klj}\rho_j \quad (38)$$

For any given coil l, this is just a discrete Fourier transform (DFT), which is easily inverted with an inverse DFT:

$$C_{jl}\rho_j \approx \frac{1}{N}\sum_k S_{kl}\exp(2\pi i jk) \quad (39)$$

However, the signals from all the coils in the array may also be grouped together into a single index p=(k,l), yielding the following matrix equation:

$$S_p \approx \sum_j B_{pj}\rho_j \quad (40)$$

or, in matrix notation, $$S \approx B\rho \quad (41)$$

Inverting this equation yields an expression for the spin density alone:

$$\rho \approx B^{-1}S \quad (42)$$

In other words, if $B^{-1}$ can be calculated, the spin density can be determined.

The encoding matrix B is constructed as an ordered list of the various encoding functions made up of coil sensitivity modulations and gradient modulations. If a complete set of $N_y$ phase encoding gradients are applied, the B matrix has dimension ($N_x*N_y*L$)×($N_x*N_y$). This is clearly overdetermined. Phase encoding gradient steps may be omitted up to a maximum factor of L (dim(B)=($N_x*N_y*L/M$)×($N_x*N_y$), where M≦L), and the B matrix will remain invertible in principle. In other words, when spatial information from an array of coils is available, the spin density may be determined from a reduced set of phase encoding gradients. This is the basis of spatial encoding in parallel imaging.

For image acquisitions of appreciable matrix size, the dimension of B is large, and brute force inversion may be quite time-consuming and memory-intensive. If, however, a Fourier transform is performed along any non-coil-encoded directions (e.g. the frequency-encoding direction in typical applications), the B matrix attains a block diagonal structure which can substantially simplify its processing. Rewriting Eq. (38) in terms of two orthogonal k-space indices $k_x$ and $k_y$, and performing an inverse DFT along the x direction (taken to be the frequency-encoding direction) gives $$\hat{S}_l(x', k_y) \equiv DFT_x^{-1}\left(\sum_x \sum_y C_{xyl}\exp(-2\pi i k_x x)\exp(-2\pi i k_y y)\rho_{x,y}\right) \quad (43)$$

$$= \frac{1}{N_x}\sum_{k_x}\exp(2\pi i k_x x')\sum_x \sum_y C_{xyl}\exp$$

$$(-2\pi i k_x x)\exp(-2\pi i k_y y)\rho_{x,y}$$

$$= \sum_x \sum_y C_{xyl}\delta_{x',x}\exp(-2\pi i k_y y)\rho_{x,y} =$$

$$\sum_y C_{x'yl}\exp(-2\pi i k_y y)\rho_{x',y}$$

A transformed B matrix may now be defined as follows:

$$\hat{B}_{(xk_y l),(x'y)} \equiv \delta_{x',x}C_{xyl}\exp(-2\pi i k_y y) \equiv \delta_{x',x}\hat{B}_{(k_y l),(y)}^{(x')} \quad (44)$$

and the spin density may be determined from a transformed matrix equation:

$$\rho_{x',y} = \sum_{p=(k_y, l)}\left(\hat{B}^{(x')}\right)^{-1}_{yp}\hat{S}_{x',p} \quad (45)$$

The delta function in Eq. (44) indicates that the transformed encoding matrix is block diagonal in the x and x' indices (which constitute subsets of the row and column indices of the matrix, which takes (x',$k_y$,l) into (x',y)). Thus, the reconstruction may proceed line by line for each position in the frequency-encoding direction, using an encoding matrix made up of coil sensitivity and gradient modulations taken only along each line. Instead of an ($N_x*N_y*L/M$)×($N_x*N_y$)-dimensional inverse, the reconstruction problem has been reduced to a total of $N_x$ inversions each of dimension ($N_y*L/M$)×($N_y$).

Figure 16:
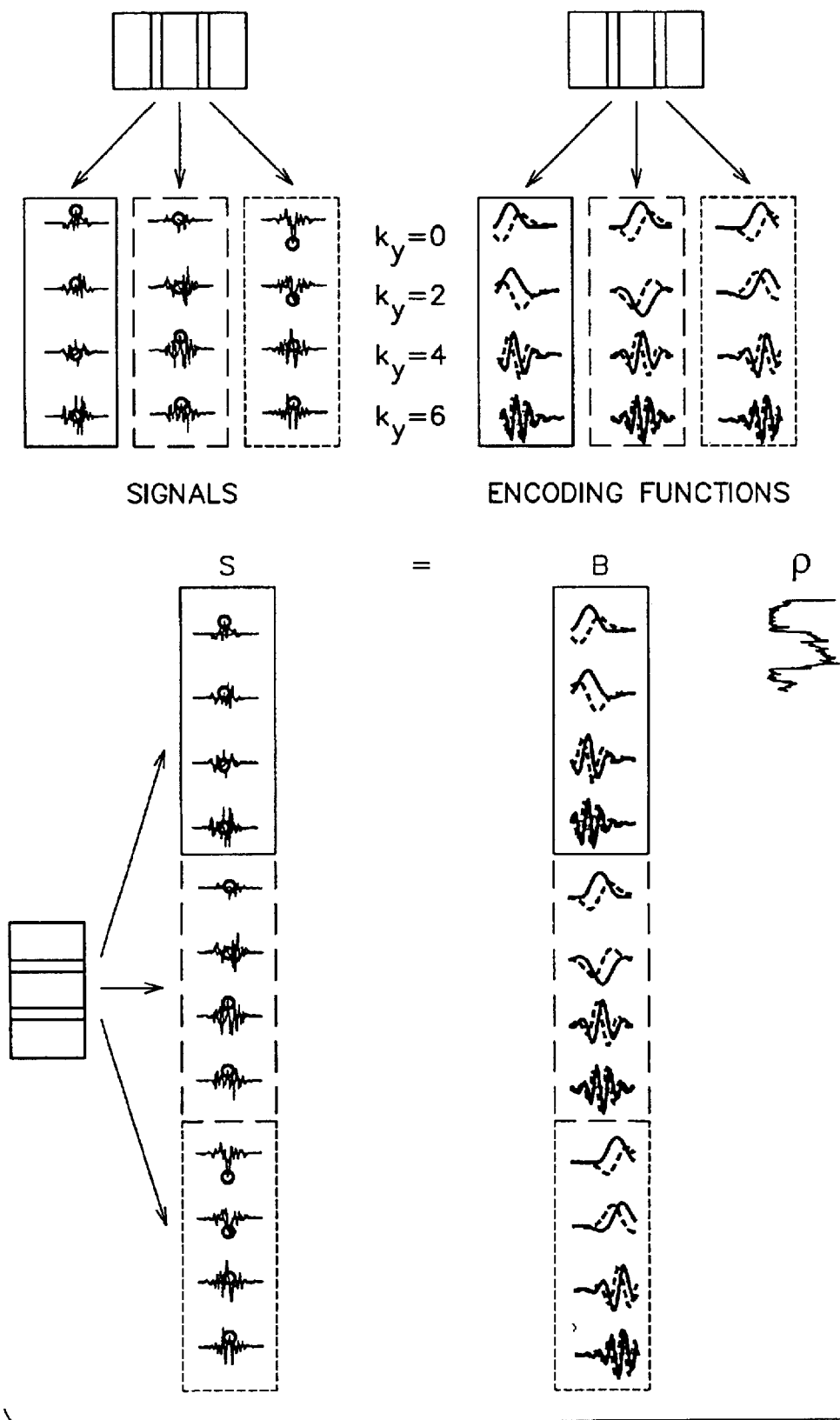
FIG. 16 demonstrates the structure and construction of one embodiment of an encoding matrix.

The structure of the transformed B matrix, and the procedure by which its entries are filled, is indicated graphically for an illustrative case in FIG. 16. At the top right of the figure, encoding functions are shown for each of three component coils and four phase encoding gradient steps (with intermediate phase encoding steps deliberately omitted for subsequent parallel reconstruction). The corresponding measured signal lines (Fourier-transformed in the frequency-encoding direction) are shown at the top left. Real and imaginary parts of the signals and the encoding functions are indicated by solid and dashed lines, respectively. The circles on the signal plots are intended to indicate that one frequency-encoding position at a time is selected, and the encoding functions at right apply only for that one position. The bottom of FIG. 16 has the structure of Equation (41), and demonstrates how the signals and encoding functions are grouped to form the signal vector and the B matrix for each frequency-encoding position.

The various encoding functions in FIG. 16 may be said to represent different "views" of the image to be reconstructed, with each measured signal point representing the projected appearance of the image from the corresponding "view." From this perspective, parallel image reconstruction bears an analogy to an X-ray computed tomography, in which an estimate of image intensity is generated from a (frequently overdetermined) set of distinct measured projections, using the apparatus of linear algebra.

Figure 17A:
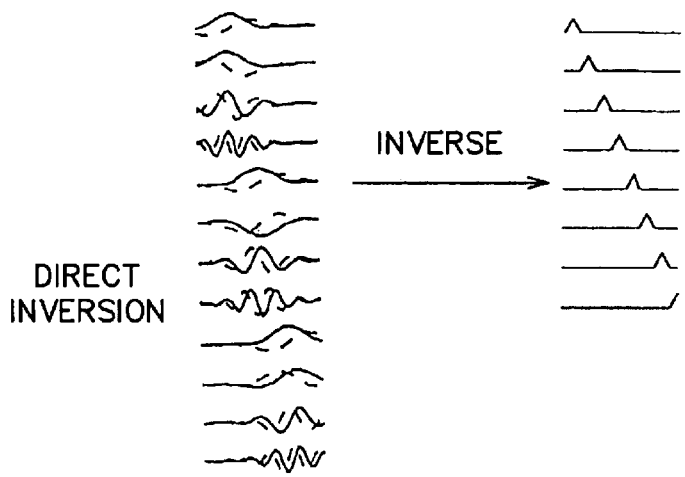
FIGS. 17a–17c demonstration various strategies for encoding matrix inversion, including approaches corresponding to the k-space and image domain approaches.
Figure 17B:
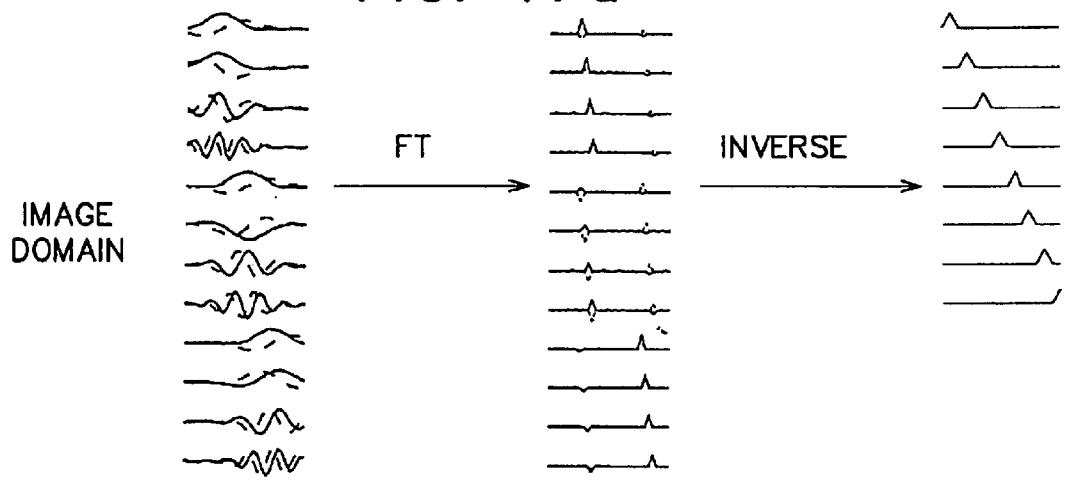
Figure 17C:
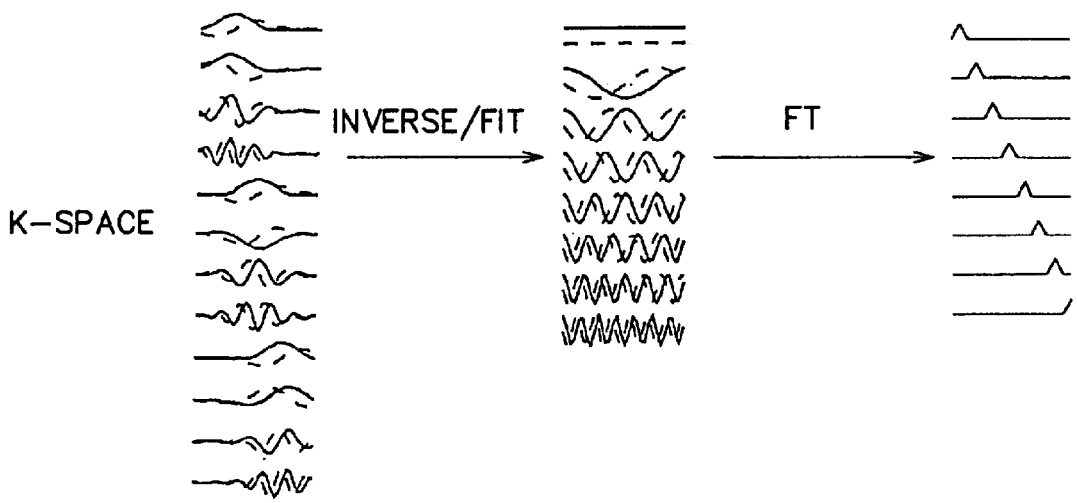

This apparatus may be brought to bear in a number of ways to invert the encoding B matrix and accomplish the reconstruction. FIGS. 17a–17c illustrates three different strategies for B matrix inversion. FIG. 17a shows a direct inversion, which may be accomplished using a suitable generalized inverse procedure such as the matrix least squares pseudoinverse or the SVD (as described earlier in the section on numerical conditioning for SMASH reconstructions). The result of the generalized inverse is a matrix which when multiplied by B generates an identity matrix (shown as a set of shifted delta functions corresponding to a unit diagonal) with the correct dimension for the reconstructed data set. Alternatively, as shown in FIG. 17a, the rows of the B matrix represent 3*4=12 vectors in an 8-dimensional space, and the inverse is a matrix that converts these vectors to a basis of 8 orthogonal (delta function) vectors spanning the space. Operation of the inverse on the ordered signal vector S generates the reconstructed pixel values directly, without need for a separate Fourier transform. That is, the normally required FT is included in the inversion.

The strategies shown in FIG. 17b and 17c involve separating out the Fourier transform as a distinct step, and combining it in varying order with an inverse or a related basis transformation. The inversion strategies in FIGS. 17b and 17c may be shown to yield the same reconstructions as image domain or k-space techniques such as SENSE or SMASH, respectively. Alternatively, hybrid approaches may be designed by choosing intermediate target bases, or by applying various approximations to the inversion.

Image-Domain Reconstructions: The Pixel Basis

An additional inverse DFT of Equation (43) in the phase-encoding direction yields $$\hat{S}_l(x', y') = DFT_y^{-1}\left(\sum_y C_{x'yl}\exp(-2\pi i k_y y)\rho_{x',y}\right) \quad (46)$$

$$= \frac{1}{N_y}\sum_{k_y=0,M,2M,\ldots}\exp(2\pi i k_y y')$$

$$\sum_y C_{x'yl}\exp(-2\pi i k_y y)\rho_{x',y}$$

$$= \sum_y \delta_{y',\left(y-\frac{mFOV_y}{M}\right)}C_{x'yl}\rho_{x',y} \equiv \sum_{m=0}^{M-1} C_{lm}\rho_m = I_l^{fold}$$

Note that, operationally, the set of encoding functions for each component coil are transformed separately, as for the inverse DFT in Eq. (43), and the results are then entered into a new transformed B matrix. Here, due to the undersampling of k-space in the phase-encoding direction, the inverse DFT results in delta functions with multiple possible nonzero values. For the particular case of a k-space sampling trajectory corresponding to a regular Cartesian grid, with undersampling by a factor of M, the doubly transformed B becomes a sparse multidiagonal matrix, as shown in FIG. 17B for M=2. This matrix may be inverted using sparse matrix techniques, or else it may be reordered into block diagonal form, yielding a distinct (L×M)-dimensional inversion for each pixel position in the reconstructed image. Each block then corresponds to a set of aliased pixels, Eq. (46) reduces to Eq. (6), and the inversion corresponds to the pixel by pixel inversion in subencoding or SENSE. From the perspective of basis transformations, the overdetermined set of differently aliased pixel values is mapped to a set of unaliased pixel values which spans the vector space of the image.

K-Space Reconstructions: The Fourier Basis

The B matrix may be transformed to other bases than the delta function pixel basis. FIG. 17c shows such a transformation, where the target basis is made up of orthogonal sinusoidal modulations—namely, spatial harmonics. In the example shown in FIG. 17c, the missing harmonics associated with k-space positions $k_y=1,3,5,7$ have been filled in. Fourier transformation in the phase-encoding direction then yields the fully-encoded image, with no aliasing. This is an example of a k-space reconstruction, in which the bulk of the processing occurs prior to Fourier transformation, and in which the final inverse DFT is performed on the composite data rather than on each component coil data set separately. Since the basis transformation in general involves some form of generalized inverse or fitting procedure, this step is labeled "inverse/fit" in the FIG. 17c.

Figure 18:
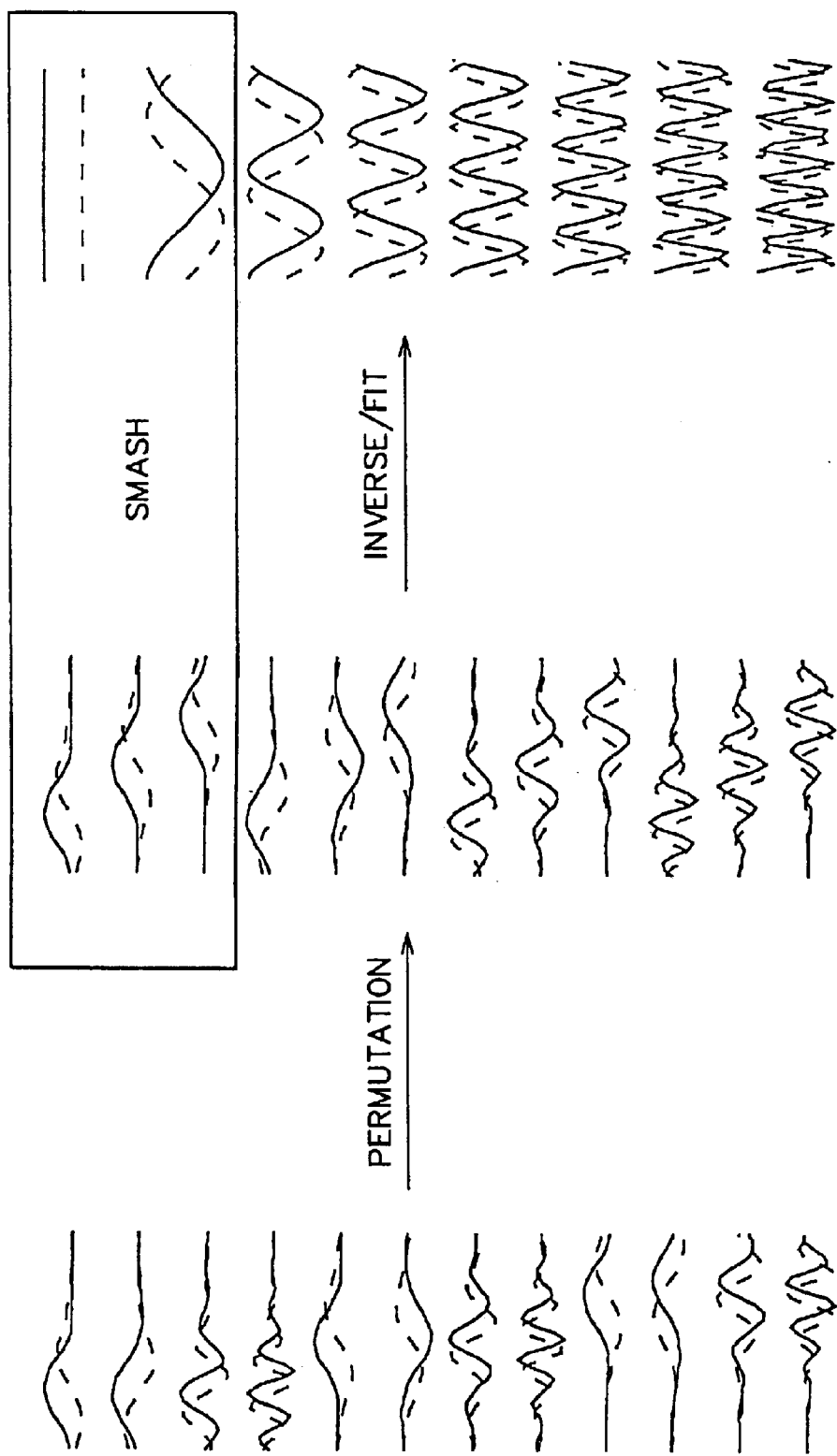
FIG. 18 illustrates steps required to generate the canonical SMASH reconstruction from a full encoding matrix inversion.

The procedure of FIG. 17c, as it stands, is not yet fully equivalent to the SMASH image reconstruction: one further simplification is required to achieve complete equivalence. FIG. 18 demonstrates this simplification. If the entries in the B matrix are first permuted so as to group the encoding functions associated with all the component coils together for any given gradient step, the topmost boxed entries in the transformation take the familiar form of the canonical SMASH fit which maps coil sensitivities to spatial harmonics.

In fact, the SMASH reconstruction is accomplished by inverting only this small sub-block of the full B matrix, and applying the resulting transformation identically to all remaining sub-blocks. Since both the encoding functions and the target harmonics for these additional sub-blocks are all harmonic multiples of the coil sensitivities or base harmonics, a separate fit of any sub-block would in principle yield the same results, so that the reduced-dimension fit may indeed be performed only once for all sub-blocks. Thus, the approximation inherent in the SMASH spatial harmonic fit may be understood as a reduction of the effective dimensionality of the encoding matrix.

One reason that this approximation is often valid, as evidenced by the success of SMASH reconstructions, stems from the spatial content of the coil sensitivities and the structure of the B matrix. If the shape of the sensitivities permits a perfect fit of the lowest-order target spatial harmonics for the single SMASH sub-block, then the fits will also be perfect for all additional sub-blocks, since these sub-blocks and target harmonics are simply harmonic multiples of the first set. Thus, in this situation, there is no need to cross sub-blocks to correct an already perfect fit.

Although no spatial harmonic fit, in general, is truly perfect, the sub-blocks do become more effectively isolated as the fit improves, and the SMASH approximation thus introduces only insignificant errors. Additionally, the influence of certain other practical sources of error are diminished. Since the effective dimensions of the B matrix are reduced and the various sub-blocks are isolated from each other in SMASH, the reconstruction is prevented from "overcorrecting" for pixel-by-pixel inaccuracies due to sensitivity calibration, errors, or noise. Thus, the SMASH approximation can serve to alleviate potential numerical instabilities which may result in practice from inversion of the larger matrix. Additionally, since only a small sub-block of the encoding matrix must be inverted, image reconstruction times can be significantly reduced.

Hybrid Reconstructions

The optimal choice of parallel reconstruction strategy, whether in k-space or in the image domain, is determined by practical constraints of the B matrix inversion in each strategy—its accuracy, its noise and error propagation characteristics, the processing time required, etc. In many cases, it may be desirable to trade off some of these features against others. Understanding the theoretical basis underlying the generalized formalism of the encoding matrix, Applicant has discovered that it is possible to form hybrid reconstruction strategies which combine some of the features and advantages of the k-space and the image domain techniques.

In one embodiment, a hybrid reconstruction may be formed by inverting larger subsets of the B matrix, i.e., by expanding the size of the inverted sub-block. This approach is shown schematically in FIGS. 19a–19c.

Figure 19C:
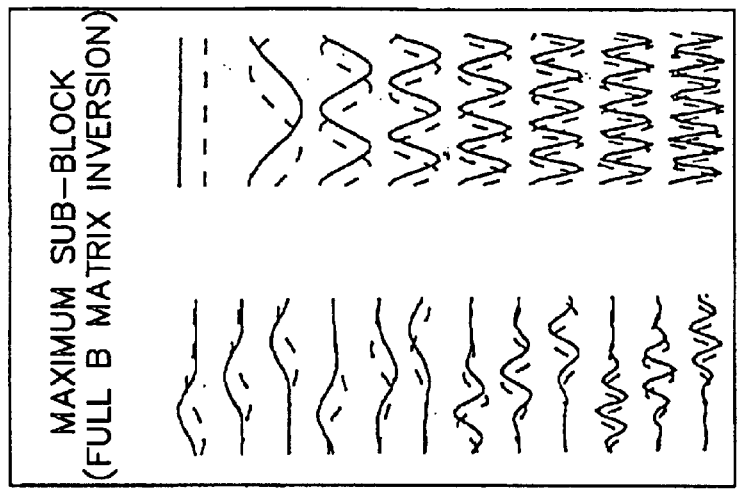
FIGS. 19a–19c illustrate schematically the relation between the minimum sub-block canonical SMASH reconstruction and expanded sub-block hybrid reconstructions.
Figure 19B:
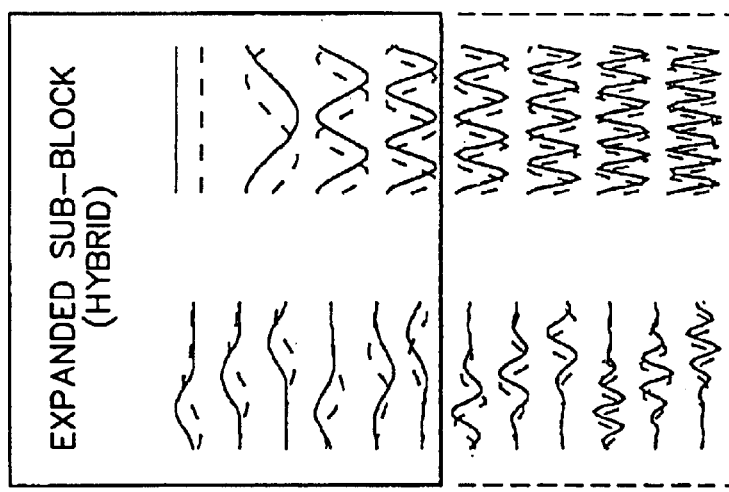
Figure 19A:
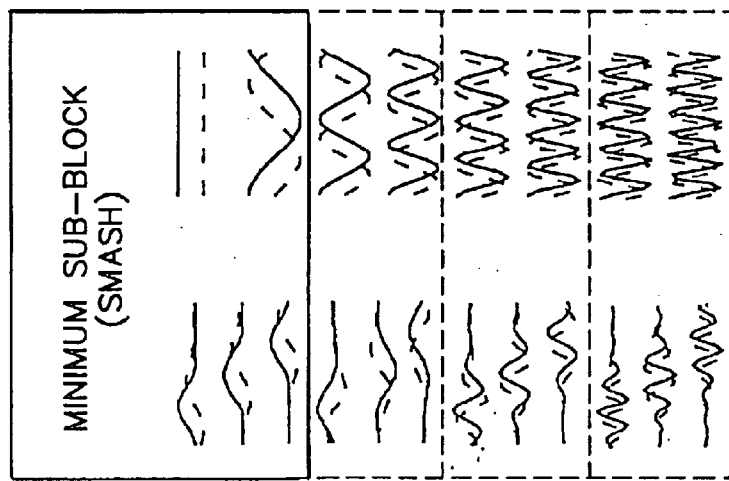

As shown in FIG. 19a, a B matrix inverted using the minimum-size sub-block, corresponds to a SMASH procedure. FIG. 19b, illustrates a hybrid reconstruction formed by choosing an expanded sub-block, including not only the pure sensitivities but also the second-harmonic-modulated encoding functions. This includes in the fit a wider range of target harmonics. FIG. 19c illustrates the largest possible sub-block, corresponding to inversion of the full B matrix, which, as discussed above, is equivalent to an image domain subencoding or SENSE reconstruction.

The expanded sub-block approach can thus be used to scale smoothly from a SMASH-equivalent reconstruction to an image-domain equivalent reconstruction. Also, since a typical image acquisition involves far more than the four phase encoding gradient steps shown in the FIG. 19b, a wide range of sub-block sizes are available.

Intermediate hybrid reconstructions, such as the one shown in FIG. 19b, share some of the numerical stability and efficiency of the SMASH technique, while also allowing some of the pixel-by-pixel control inherent in the image-domain techniques. The element of approximation is progressively reduced as the sub-block is expanded, which may be useful in cases for which a pure SMASH reconstruction shows an undesirable level of residual aliasing artifacts.

In the expanded sub-block fits, the independence of the various encoding function sets is relaxed, so that corrections from higher-frequency encoding functions may be used to improve the basic SMASH fit, and more accurate spatial harmonics may be generated. On the other hand, expansion of the sub-block increases reconstruction time, and sacrifices some of the protection against "overcorrection" for localized noise and calibration errors. In addition, larger blocks of k-space lines must be collected prior to combination in an expanded sub-block reconstruction, so that the reconstruction becomes more cumbersome to implement in real time than the pure SMASH reconstruction, which may in principle be performed as each point of line of k-space is acquired in the scanner.

Figure 20:
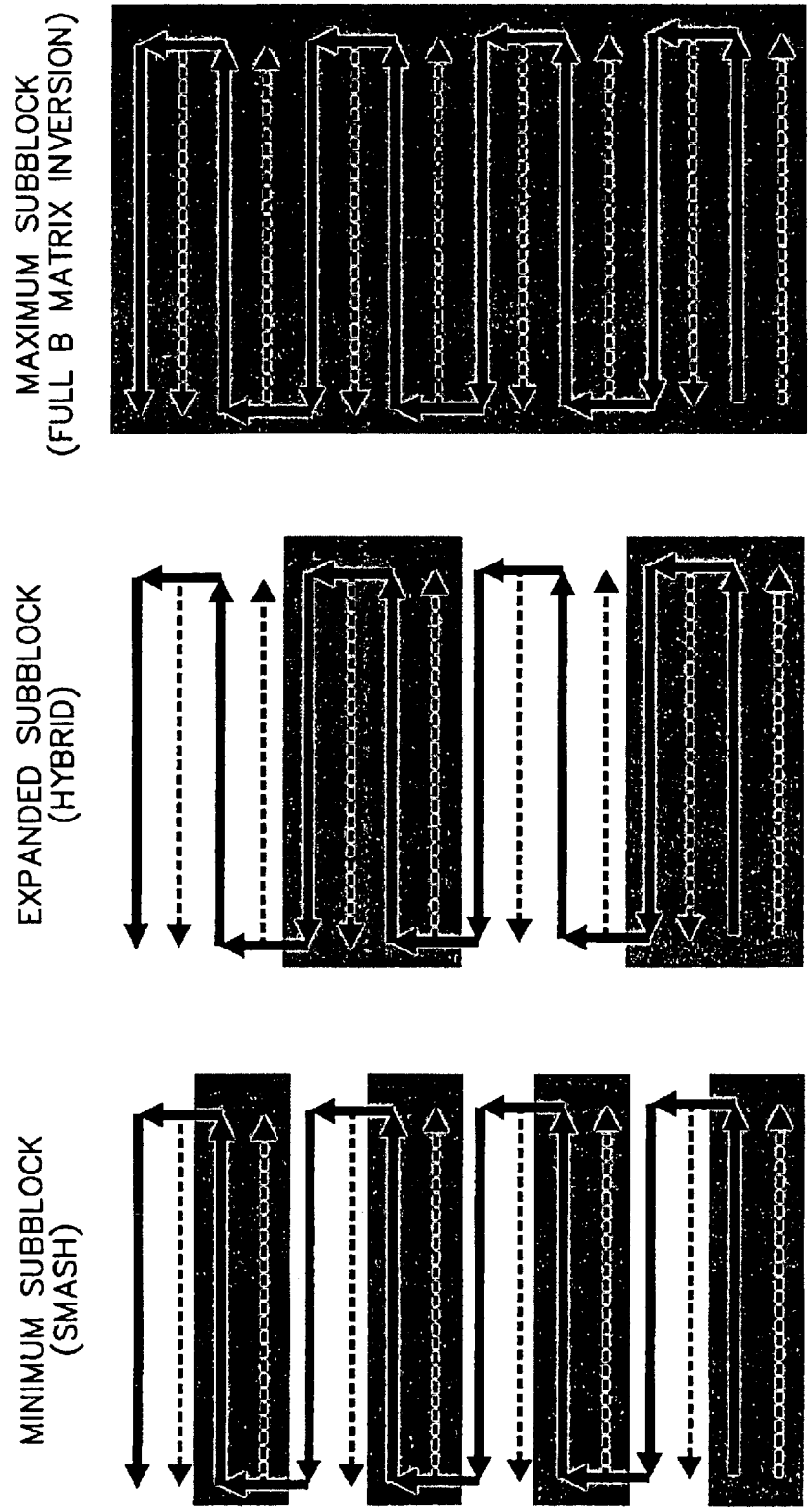
FIG. 20 illustrates schematically the grouping of acquired k-space lines upon which operations are performed in expanded sub-block hybrid reconstructions.

FIG. 20 shows the grouping of k-space lines for which separate combinations are formed in expanded sub-block hybrid reconstructions. Thick solid lines represent acquired data lines (in a schematic EPI-style k-space trajectory), and thinner dashed lines represent data lines to be filled in by parallel reconstruction. As the sub-block is expanded, larger groups of acquired k-space lines (grouped by alternately colored backgrounds) are combined to form correspondingly larger sets of reconstructed lines. Thus, the flexibility of the expanded sub-block hybrid approach does come at some price in computational complexity and reconstruction time, but the added flexibility may frequently be worth the price in practical imaging situations.

It should also be noted that the expanded sub-block approach may be used in connection with the design of arrays for parallel imaging: the inherent degree of independence of sub-blocks in a measured B matrix may be used to assess the encoding capabilities of an given coil array, and to select among various designs.

Figure 21:
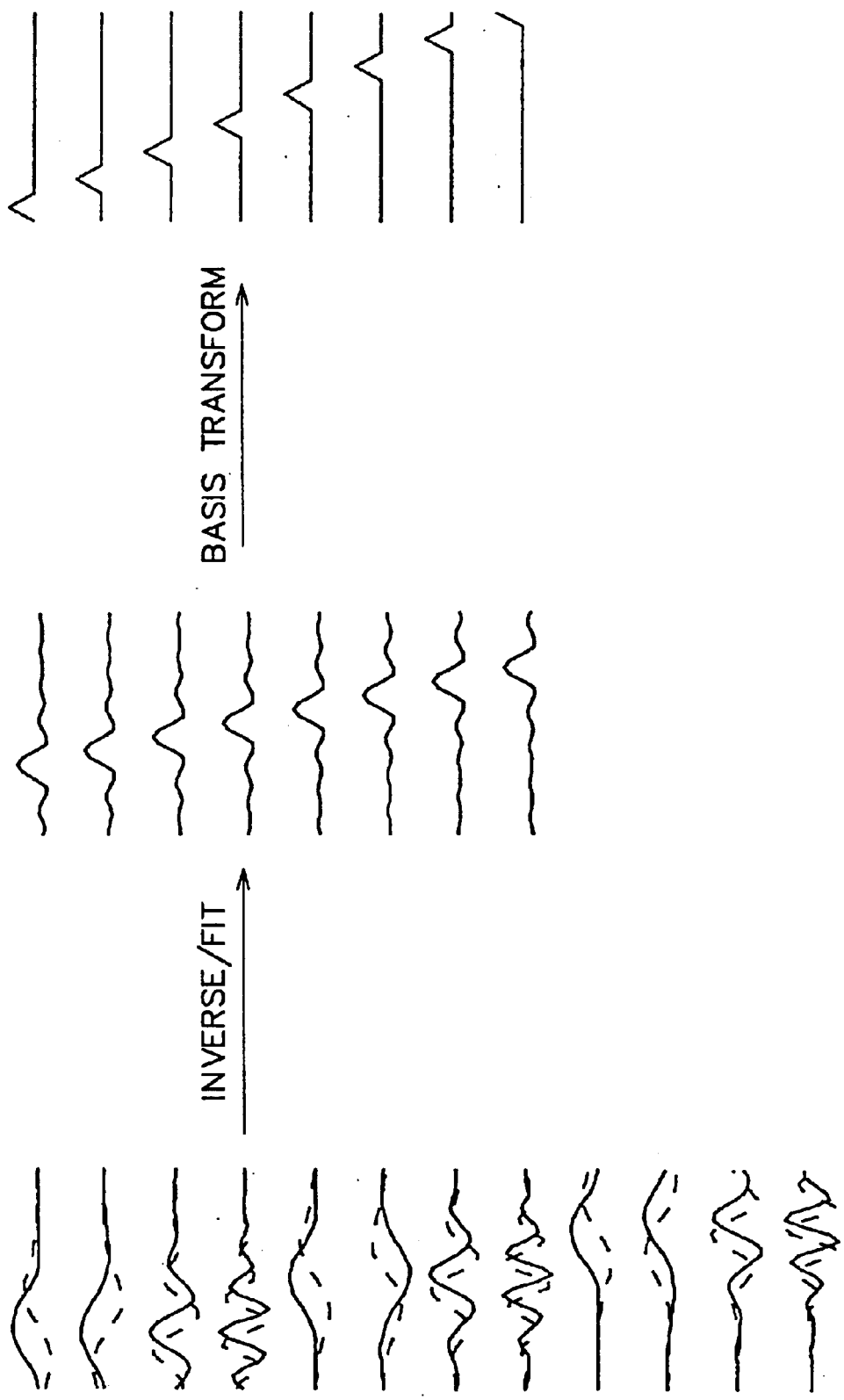
FIG. 21 demonstrates an encoding matrix inversion strategy corresponding to an intermediate-basis hybrid reconstruction.

Another form of hybrid reconstruction results from using a target basis intermediate between the pixel basis and the Fourier basis described above. For example, a partially localized basis, such as a wavelet basis, may be used. This approach is shown schematically in FIG. 21. If direct inversion of the B matrix to a spatially localized delta function basis is poorly behaved, a more delocalized set of basis functions may be used as an intermediate, as illustrated in FIG. 21.

Additionally, the multi-line SMASH fits, as described above, form a type of hybrid between k-space and image-domain reconstructions. Specifically, in the multi-line SMASH fit, one Fourier transform is performed before the fit, and the remaining Fourier transform is performed afterwards. As discussed above, this allows flexibility in the choice of the number of distinct lines for which to perform a separate fit. This same flexibility is inherent in the block-diagonalization of the B matrix by Fourier transformation in the frequency-encoding direction. Thus, for any of the B matrix inversion strategies described so far, the number of lines to be separately reconstructed may be varied at will.

In Vivo Sensitivities

Any of the generalized reconstruction strategies described here may be used with in vivo sensitivities, taking advantage of the pixel-by-pixel freedom already described for SMASH and image domain reconstructions in earlier sections. As a result of this freedom, no separate body coil reference acquisition is required.

Numerical Conditioning

Eigenvalue conditioning, such as using a matrix least-squares pseudoinverse, SVD, or other generalized inverse procedure in combination with eigenvalue thresholding, as described above, may also be applied to any of the B matrix inversion strategies, including the k-space, image domain, and hybrid inversions. Numerical conditioning, in this situation, enables effective compensation for noise or for systematic errors in coil sensitivity calibration, and can result in improved image quality and signal-to-noise ratio under a wide range of conditions.

Conditioning also enables automatic threshholding, which only excludes or approximates regions of the image which are destined to yield large errors in the reconstruction, and as a result may be used in conjunction with simple in vivo sensitivity references, without requiring additional processing or acquisition of an accompanying body coil image.

Numerical conditioning of the generalized B matrix is somewhat different than the numerical conditioning used in connection with the pixel-by-pixel image-domain inversion. Specifically, in the generalized B matrix inversion, eigenvalue thresholds may be applied to entire matrices, or to matrix blocks, governing the reconstruction of multiple different pixels. Thus, particular image regions may be eliminated or approximated based on a comparison with neighboring regions, rather than by application of a single region-independent criterion.

The combination of numerical conditioning with hybrid reconstruction strategies may be particularly powerful for high acceleration factors, where accuracy is important but intrinsic numerical stability may be poor.

Additional Dimensions and Generalizations

It is also possible to apply the techniques and theories described herein to multi-dimensional imaging (multiple phase-encoded/coil-encoded directions) and to imaging using irregular k-space sampling trajectories. Of course, such situations may require inversion of larger subsets of the full B matrix, at some cost in processing time.

In 3D MR imaging, after selection of a volumetric slab using appropriate RF pulses and selection gradients, phase encoding gradients are applied separately along not one but two phase-encoding directions, and the image set is generated from the signal data using a 3D Fourier transform. In a related field of spectroscopic imaging, two phase-encoded directions are often used for 2D imaging, while the "frequency-encoded" direction is reserved for gathering of spectroscopic data. In such situations, encoding functions for the extra phase-encoding direction may be included in the B matrix, which may then be inverted using any of the procedures described above for 2D imaging. One or more Fourier transforms optionally may be applied to further block diagonalize the matrix, also as described above.

Additionally, the improvements to SMASH and image domain reconstructions may also be applied to 3D imaging. For SMASH, this may be accomplished by fitting tailored spatial harmonics along each of the phase-encoding (or even the frequency-encoding) directions, and applying appropriate linear combinations of component coil signals to produce k-space shifts along the corresponding directions. For image domain techniques, sensitivity matrices involving aliased pixels along multiple dimensions may be formed and inverted. Using all these approaches, multiplicative simultaneous accelerations along multiple directions may be achieved (e.g. 2-fold acceleration along x and 2-fold acceleration along y resulting in 4-fold total acceleration). Numerical conditioning, discussed above, can be applied to three dimensional imaging or to non-Cartesian imaging as well.

Non-Cartesian k-space sampling trajectories, such as spiral trajectories, may also be handled using encoding functions that match the sampled trajectories. Optionally, for SMASH, tailored harmonics may be generated along arbitrary k-space directions to fill in missing data points.

EXAMPLES

Figure 22A:
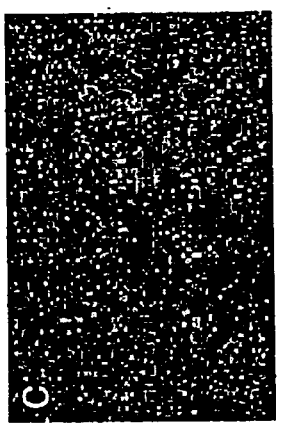
FIGS. 22a–22e demonstrate various generalized parallel image reconstructions in a phantom imaging experiment.
Figure 22B:
Figure 22C:
Figure 22D:
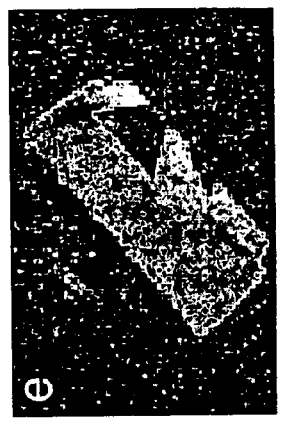
Figure 22E:

FIG. 22a–e shows several examples of generalized parallel image reconstructions in a phantom imaging experiment. In this sequence of figures, FIG. 22a is a reference image and FIGS. 22b–e are six-fold accelerated phantom images in a double-oblique image plane. Specifically, FIG. 22b is a SENSE reconstruction, using a processed sensitivity reference derived from the quotient of separately acquired surface coil and body coil images; FIG. 22c is a subencoding reconstruction using a raw surface coil sensitivity reference without additional body coil image; FIG. 22d is a generalized reconstruction with an SVD eigenvalue threshold and a raw surface coil reference; and FIG. 22e is a generalized extended sub-block hybrid reconstruction using a raw surface coil reference.

Figure 23A:
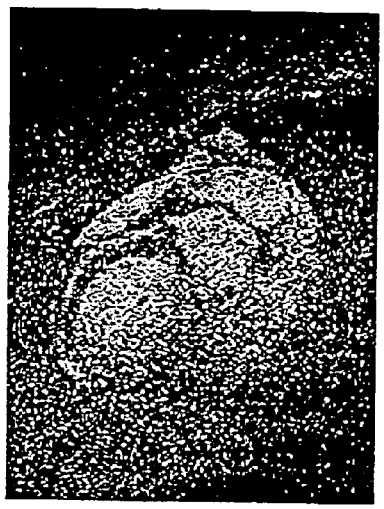
FIGS. 23a–23b compare reconstructions of a five-fold accelerated cardiac MR image using unconditioned SMASH and an expanded sub-block hybrid with numerical conditioning, respectively.
Figure 23B:

FIGS. 23a–23b compare reconstructions of a five-fold accelerated cardiac MR image using unconditioned SMASH and an expanded sub-block hybrid with numerical conditioning, respectively. The same acquired data were used as for FIG. 14, i.e., a 6-element coil array and an in vivo sensitivity reference. The hybrid reconstruction in FIG. 23b used a sub-block size of four (i.e. a block of 4*6=24 encoding functions was inverted to reconstruct 4*5=20 k-space lines at a time). For numerical conditioning in FIG. 23b, an SVD eigenvalue threshold of 25% of the maximum eigenvalue was chosen, with sub-threshold eigenvalues set equal to the threshold value.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of forming a magnetic resonance image, comprising the steps of:
    measuring RF signals indicative of nuclear spins simultaneously in each of a plurality of RF receiving coils, each said RF receiving coil having a different spatial sensitivity;
    tailoring a set of spatial harmonic functions to adjust for variations in at least one of angulation of an image plane, field of view, and coil sensitivity calibration, thus forming a set of tailored spatial harmonics;
    determining coil calibration coefficients, by performing a spatial harmonic fit of the different spatial sensitivities to the set of tailored spatial;
    applying the determined coil calibration coefficients to the measured RF signals to form multiple lines of k-space data; and
    transforming the k-space data to a MRI image.

2. The method of claim 1, further comprising the steps of:
    forming a sensitivity matrix representing the coil sensitivities;
    conditioning the sensitivity matrix;
    inverting the sensitivity matrix to determine the calibration coefficients; and
    using the conditioned inverted sensitivity matrix during the step of applying the determined coil calibration coefficients.

3. The method of claim 1, wherein the step of transforming the k-space data comprises performing one or more Fourier transforms to the k-space data.

4. The meted of claim 1, wherein the step of tailoring the set of spatial harmonic functions comprises automatically selecting a subset of the set of spatial harmonic functions, and wherein the step of determining coil calibration coefficients comprises performing a spatial harmonic fit of the different spatial sensitivities to the subset of tailored spatial harmonics.

5. The method of claim 1, wherein the step of tailoring the set of spatial harmonic functions comprises adjusting the set of spatial harmonic functions by a function not equal to 1 to adjust for sensitivity variations along a phase encode direction.

6. The method of claim 5, wherein the sensitivity variations along the phase encode direction result from angulation of the image plane in the phase encode direction, which results in asymmetries in the coil sensitivities.

7. The method of claim 5, wherein the function is selected to improve fitting at the edges of an extended field of view where the coil sensitivities fall off.

8. The method of claim 5, wherein the step of adjusting the set of spatial harmonic functions by a function comprises a step of multiplying the set of spatial harmonic functions by the function.

9. The method of claim 5, wherein the function is a phased sum of the different spatial sensitivities.

10. The method of claim 1, wherein the step of determining coil calibration coefficients determines coil calibration coefficients for more than one particular spatial position by performing a spatial harmonic fit of the different spatial sensitivities at the particular spatial positions to the set of tailored spatial harmonics, and the step of applying applies the determined coil calibration coefficients to measured RF signals corresponding to the particular spatial positions.

11. The method of claim 1, further comprising:
    segmenting the different spatial sensitivities into strips, each represented by an individual coil sensitivity profile, and
    wherein the step of determining coil calibration coefficients performs a spatial harmonic fit of the strips of different spatial sensitivities to the set of tailored spatial harmonics.

12. The method of claim 11, wherein the number of strips is between 2 and a number of frequency-encoding positions.

13. The method of claim 1, wherein the step of transforming the k-space data comprises the steps of:
    performing a Fourier transform to the measured RF signals;
    segmenting the resulting transformed signals into stripe; and
    applying separate weighting coefficients to each strip.

14. The method of claim 1, further comprising the step of adjusting each different spatial sensitivity by a function not equal to 1 and adjusting the spatial harmonic functions by the same function.

15. The method of claim 1, wherein the step of determining coil calibration coefficients comprises the step of performing a fit of in vivo sensitivity references to the tailored spatial harmonics multiplied by a combination of the in vivo sensitivity references.

16. The method of claim 15, wherein low resolution in vivo sensitivity references are used.

17. The method of claim 15, wherein the combination is a phased sum of in vivo sensitivity references.

18. An apparatus for generating a magnetic resonance image, comprising:
    a plurality of RF receiving coils, each said RF receiving coil having a different spatial sensitivity and configured to measure RF signals indicative of nuclear spins of nuclei in a test subject; and
    a controller, said controller being configured to (a) tailor a set of spatial harmonic functions and form a set of tailored spatial harmonics that have been adjusted for variations in at last one of angulation of an image plane, field of view, and coil sensitivity calibration; (b) determine coil calibration coefficients by performing a spatial harmonic fit of the different spatial sensitivities to the set of tailored spatial harmonics; (c) apply the determined coil calibration coefficients to the measured RF signals to form multiple lines of k-space data; (d) and transform the k-space data to a MRI image.

19. The apparatus of claim 18, wherein the controller is further configured to form a sensitivity matrix representing the coil sensitivities, condition the sensitivity matrix, invert the sensitivity matrix to determine the calibration coefficients, and use the conditioned inverted sensitivity matrix while applying the determined coil calibration coefficients.

20. The apparatus of claim 18, wherein the controller is configured to transform the k-space data by performing one or more Fourier transforms to the k-space data.

21. The apparatus of claim 18, wherein the controller is configured to tailor the set of spatial harmonic functions by automatically selecting a subset of the set of the spatial harmonic functions, and wherein the controller is configured to determine coil calibration coefficients by performing a spatial harmonic fit of the different spatial sensitivities to the subset of tailored spatial harmonics.

22. The apparatus of claim 18, wherein the controller is configured to tailor the set of spatial harmonic functions by adjusting the set of spatial harmonic functions by a function not equal to 1 to adjust for sensitivity variations along a phase encode direction.

23. The apparatus of claim 18, wherein the controller is configured to determine coil calibration coefficients for more than one particular spatial position by performing a spatial harmonic fit of the different spatial sensitivities at the particular spatial positions to the set of tailored spatial harmonics, and the controller is configured to apply the determined coil calibration coefficients to measured RF signals corresponding to the particular spatial positions.

24. The apparatus of claim 18, wherein the controller is further configured to segmenting the different spatial sensitivities into strips, each represented by an individual coil sensitivity profile, and perform a spatial harmonic fit of the strips of different spatial sensitivities to the set of tailored spatial harmonics.

25. The apparatus of claim 18, wherein the controller is configured to perform a Fourier transform to the measured RF signals, segment the resulting transformed signals into strips, and apply separate weighting coefficients to each strip.

26. The apparatus of claim 18, wherein the controller is configured to adjust each different spatial sensitivity by a function not equal to 1 and to adjusting the spatial harmonics by the same function.

27. The apparatus of claim 18, wherein the controller is configured to perform a fit of in vivo sensitivity references to the tailored spatial harmonics multiplied by a combination of the in vivo sensitivity references.

28. The apparatus of claim 27, wherein low resolution in vivo sensitivity references are used.

* * * * *